(12) United States Patent
Choi

(10) Patent No.: US 11,515,290 B2
(45) Date of Patent: Nov. 29, 2022

(54) SEMICONDUCTOR PACKAGE

(71) Applicant: SAMSUNG ELECTRONICS CO., LTD., Suwon-si (KR)

(72) Inventor: Yun Seok Choi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/021,112

(22) Filed: Sep. 15, 2020

(65) Prior Publication Data
US 2021/0272930 A1 Sep. 2, 2021

(30) Foreign Application Priority Data

Feb. 28, 2020 (KR) .................. 10-2020-0025383

(51) Int. Cl.
| | |
|---|---|
| *H01L 25/065* | (2006.01) |
| *H01L 23/538* | (2006.01) |
| *H01L 23/367* | (2006.01) |
| *H01L 23/31* | (2006.01) |
| *H01L 23/48* | (2006.01) |

(52) U.S. Cl.
CPC ...... *H01L 25/0652* (2013.01); *H01L 23/3128* (2013.01); *H01L 23/3135* (2013.01); *H01L 23/367* (2013.01); *H01L 23/481* (2013.01); *H01L 23/5383* (2013.01); *H01L 23/5385* (2013.01)

(58) Field of Classification Search
CPC ............. H01L 25/0652; H01L 23/3128; H01L 23/3135; H01L 23/367; H01L 23/481; H01L 23/5383; H01L 23/5385
See application file for complete search history.

(56) References Cited

U.S. PATENT DOCUMENTS

| | | | |
|---|---|---|---|
| 8,580,616 B2 | 11/2013 | Nalla et al. | |
| 9,048,233 B2 | 6/2015 | Wu et al. | |
| 9,935,087 B2 | 4/2018 | Zhai et al. | |
| 10,163,856 B2 | 12/2018 | Chen et al. | |
| 10,319,698 B2 | 6/2019 | Cheah et al. | |
| 10,325,880 B2 | 6/2019 | Woychik et al. | |
| 2016/0142155 A1* | 5/2016 | Kim ............. | H04B 10/803 398/141 |
| 2018/0102311 A1* | 4/2018 | Shih ............. | H01L 21/486 |
| 2018/0269181 A1* | 9/2018 | Yang ............ | H01L 21/561 |

(Continued)

FOREIGN PATENT DOCUMENTS

KR 101099578 B1 12/2011

*Primary Examiner* — Fernando L Toledo
*Assistant Examiner* — Neil R Prasad
(74) *Attorney, Agent, or Firm* — Volentine, Whitt & Francos, PLLC

(57) ABSTRACT

A semiconductor package includes an upper substrate having a first surface and a second surface which are opposite to each other, a lower semiconductor chip disposed on the first surface of the upper substrate, a plurality of conductive pillars disposed on the first surface of the upper substrate at at least one side of the lower semiconductor chip, and an upper semiconductor chip disposed on the second surface of the upper substrate. The lower semiconductor chip and the plurality of conductive pillars are connected to the first surface of the upper substrate, and the upper semiconductor chip is connected to the second surface of the upper substrate.

17 Claims, 20 Drawing Sheets

(56) References Cited

U.S. PATENT DOCUMENTS

2018/0308791 A1   10/2018  Zhao et al.
2019/0131273 A1*  5/2019  Chen ..................... H01L 21/568
2019/0148338 A1   5/2019  Watanabe et al.
2019/0385977 A1* 12/2019  Elsherbini ............... H01L 25/50

* cited by examiner

SEMICONDUCTOR PACKAGE

CROSS-REFERENCE TO RELATED APPLICATION

A claim of priority under 35 U.S.C. § 119 is made to Korean Patent Application No. 10-2020-0025383, filed on Feb. 28, 2020, in the Korean Intellectual Property Office, the entirety of which is hereby incorporated by reference.

BACKGROUND

The present disclosure relates to semiconductor packages, and more particularly to semiconductor package in which a plurality of semiconductor chips are mounted.

An integrated circuit chip may be realized in the form of a semiconductor package so as to be appropriately applied to an electronic product. In a typical semiconductor package, a semiconductor chip may be mounted on a printed circuit board (PCB) and may be electrically connected to the PCB through bonding wires or bumps. In view of the increased demand for small, light and multi-functional electronic devices, there has recently been increased interest in multi-chip packages and/or system-in packages. A multi-chip package may be characterized as a single semiconductor package in which chips are stacked, and a system-in package may be characterized as a single semiconductor package in which different kinds of chips are mounted to operate as a system.

SUMMARY

Embodiments of the inventive concepts provide a semiconductor package in which a plurality of semiconductor chips can be easily mounted and in which integration density may be easily increased.

Embodiments of the inventive concepts provide a semiconductor package including an upper substrate having a first surface and a second surface opposite to each other, a lower semiconductor chip disposed on the first surface of the upper substrate, a plurality of conductive pillars disposed on the first surface of the upper substrate at at least one side of the lower semiconductor chip, and an upper semiconductor chip disposed on the second surface of the upper substrate. The lower semiconductor chip and the plurality of conductive pillars are connected to the first surface of the upper substrate, and the upper semiconductor chip is connected to the second surface of the upper substrate.

Embodiments of the inventive concepts further provide a semiconductor package including an upper substrate having a first surface and a second surface opposite to each other, a plurality of lower semiconductor chips on the first surface of the upper substrate and laterally spaced apart from each other, a plurality of conductive pillars on the first surface of the upper substrate and laterally spaced apart from the plurality of lower semiconductor chips, and a plurality of upper semiconductor chips on the second surface of the upper substrate and laterally spaced apart from each other. The upper substrate includes first upper substrate pads adjacent to the first surface, and second upper substrate pads adjacent to the second surface. Each of the plurality of lower semiconductor chips may include lower chip pads connected to corresponding ones of the first upper substrate pads, and the plurality of conductive pillars may be connected to corresponding ones of the first upper substrate pads. Each of the plurality of upper semiconductor chips include upper chip pads connected to corresponding ones of the second upper substrate pads.

Embodiments of the inventive concepts still further provide a semiconductor package including an upper substrate having a first surface and a second surface opposite to each other, a lower semiconductor chip disposed on the first surface of the upper substrate, an intermediate substrate disposed on the first surface of the upper substrate at at least one side of the lower semiconductor chip, and an upper semiconductor chip disposed on the second surface of the upper substrate. The lower semiconductor chip and the intermediate substrate are connected to the first surface of the upper substrate, and the upper semiconductor chip is connected to the second surface of the upper substrate. The intermediate substrate may is a semiconductor chip, a printed circuit board, an interposer substrate, or a redistribution substrate. The intermediate substrate includes through-electrodes penetrating therethrough.

Embodiments of the inventive concepts also provide a semiconductor package including a first substrate having a first surface and a second surface opposite each other; a second substrate having a first surface facing the first surface of the first substrate; a plurality of first semiconductor chips and a plurality of conductive pillars disposed between the first and second substrates, the plurality of first semiconductor chips mounted on the first surface of the first substrate, at least one of the plurality of first semiconductor chips including a plurality of through-electrodes electrically connected to the first substrate, and the plurality of conductive pillars laterally spaced away from the plurality of first semiconductor chips and electrically connected to the first and second substrates; and a plurality of second semiconductor chips disposed on the second surface of the first substrate and electrically connected to the first substrate.

BRIEF DESCRIPTION OF THE DRAWINGS

Embodiments of the inventive concepts will become more apparent in view of the following detailed description as made in view of the attached drawings.

DETAILED DESCRIPTION OF THE EMBODIMENTS

Hereinafter, embodiments of the inventive concepts will be described in detail with reference to the accompanying drawings.

Figure 1:
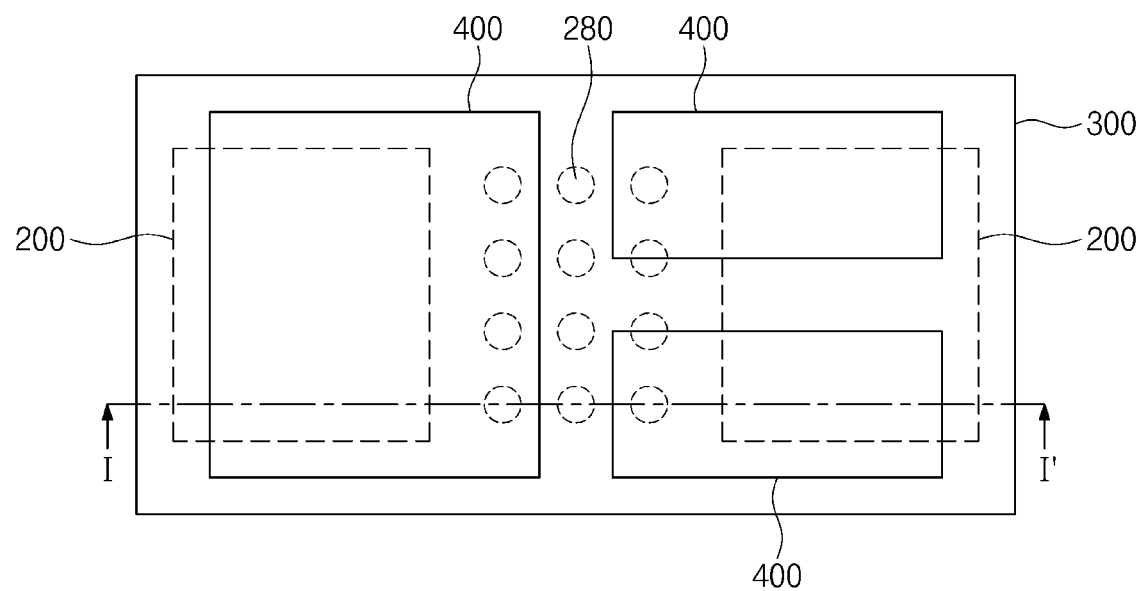
FIG. 1 illustrates a plan view of a semiconductor package according to embodiments of the inventive concepts.
Figure 2:
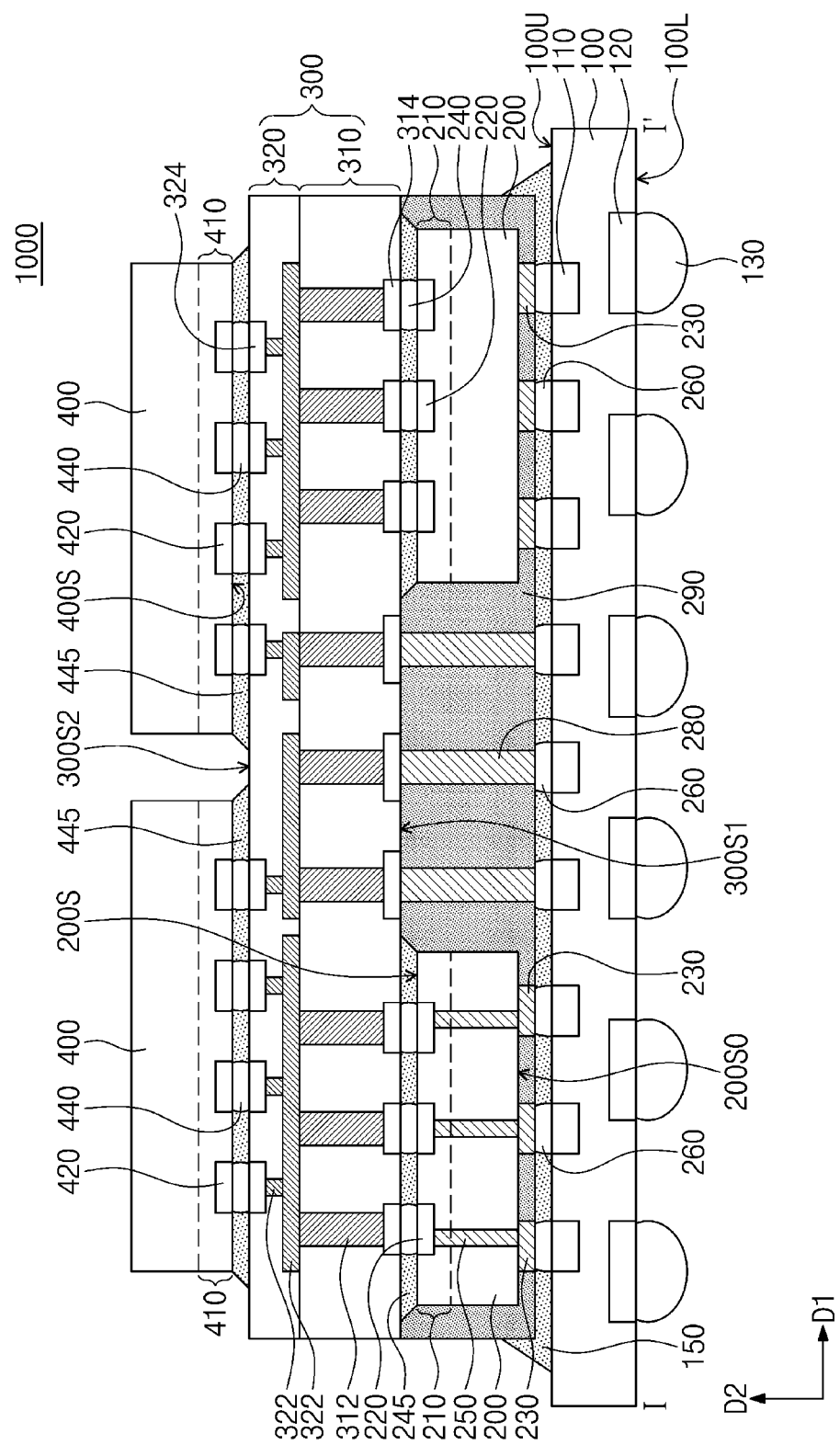
FIG. 2 illustrates a cross-sectional view taken along a line I-I' of FIG. 1.

FIG. 1 illustrates a plan view of a semiconductor package according to e embodiments of the inventive concepts. FIG. 2 illustrates a cross-sectional view taken along a line I-I' of FIG. 1.

Referring to FIGS. 1 and 2, a semiconductor package 1000 may include a lower substrate 100, an upper substrate 300 on the lower substrate 100, a lower semiconductor chip 200 disposed between the lower substrate 100 and the upper substrate 300, a plurality of conductive pillars 280 disposed at at least one side of the lower semiconductor chip 200 between the lower substrate 100 and the upper substrate 300, and an upper semiconductor chip 400 disposed on the upper substrate 300.

The upper substrate 300 may have a first surface 300S1 and a second surface 300S2 which are opposite to each other. The upper substrate 300 may be disposed on the lower substrate 100 in such a way that the first surface 300S1 faces a top surface 100U of the lower substrate 100. The upper substrate 300 may include first upper substrate pads 314 adjacent to the first surface 300S1, and second upper substrate pads 324 adjacent to the second surface 300S2. The first and second upper substrate pads 314 and 324 may include a conductive material.

In some embodiments, the upper substrate 300 may be a silicon interposer substrate. In this case, the upper substrate 300 may include a through-via layer 310, and a metal interconnection layer 320 on the through-via layer 310. The metal interconnection layer 320 may be disposed adjacent to the second surface 300S2 of the upper substrate 300, and the through-via layer 310 may be spaced apart from the second surface 300S2 of the upper substrate 300 with the metal interconnection layer 320 interposed therebetween. The metal interconnection layer 320 may include metal interconnection lines 322 disposed adjacent to the second surface 300S2 of the upper substrate 300. The metal interconnection lines 322 may be connected to the second upper substrate pads 324. The through-via layer 310 may include through-vias 312 connected to the metal interconnection lines 322. The through-vias 312 may extend (e.g., vertically extend) from the metal interconnection lines 322 toward the first surface 300S1 of the upper substrate 300. The through-vias 312 may be connected to the first upper substrate pads 314. The through-vias 312 may include a conductive material. The first upper substrate pads 314 may be electrically connected to the second upper substrate pads 324 through the through-vias 312 and the metal interconnection lines 322.

The first upper substrate pads 314 and the second upper substrate pads 324 may have widths (or pitches) in a first direction D1 parallel to the first surface 300S1. For example, the widths (or pitches) of the first upper substrate pads 314 and the second upper substrate pads 324 may be greater than about 1 μm and less than about 30 μm. The upper substrate 300 may have a thickness in a second direction D2 perpendicular to the first surface 300S1. For example, the upper substrate 300 may have a thickness of about 30 μm to about 150 μm.

The lower semiconductor chip 200 may be disposed on the first surface 300S1 of the upper substrate 300 and may be connected to the first surface 300S1 of the upper substrate 300. In some embodiments, a plurality of the lower semiconductor chips 200 may be disposed between the upper substrate 300 and the lower substrate 100. The plurality of lower semiconductor chips 200 may be disposed on the first surface 300S1 of the upper substrate 300 and may be laterally spaced apart from each other in the first direction D1 parallel to the first surface 300S1. Each of the plurality of lower semiconductor chips 200 may be connected to the first surface 300S1 of the upper substrate 300. The plurality of lower semiconductor chips 200 may be, for example, the same kind of semiconductor chips. In other words, the plurality of lower semiconductor chips 200 may be for example memory chips, logic chips, application processor (AP) chips, or system-on-chips (SOCs). As other examples, the plurality of lower semiconductor chips 200 may include different kinds of semiconductor chips. In other words, the plurality of lower semiconductor chips 200 may include different semiconductor chips selected from a group consisting of a memory chip, a logic chip, an application processor (AP) chip, and a system-on-chip (SOC).

One surface 200S of the lower semiconductor chip 200 may face the first surface 300S1 of the upper substrate 300. The lower semiconductor chip 200 may include a lower circuit layer 210 adjacent to, for example, the one surface 200S of the lower semiconductor chip 200. The lower circuit layer 210 may include integrated circuits. Alternatively, in contrast to FIG. 2, the lower circuit layer 210 may be disposed adjacent to another surface 200SO of the lower semiconductor chip 200.

The lower semiconductor chip 200 may include lower chip pads 220 adjacent to the one surface 200S of the lower semiconductor chip 200. The lower chip pads 220 may include a conductive material. The lower chip pads 220 may be connected to corresponding ones of the first upper substrate pads 314. In some embodiments, lower bumps 240 may be disposed between the lower chip pads 220 and the corresponding first upper substrate pads 314. Each of the lower chip pads 220 may be connected to corresponding ones of the corresponding first upper substrate pads 314 through corresponding ones of the lower bumps 240. Each of the lower bumps 240 may include a conductive material and may have at least one of a solder ball shape, a bump shape, or a pillar shape. In some embodiments, a lower underfill layer 245 may be disposed between the one surface 200S of the lower semiconductor chip 200 and the first surface 300S1 of the upper substrate 300 and may cover the lower bumps 240. The lower underfill layer 245 may be locally disposed on the one surface 200S of the lower semiconductor chip 200 and may fill a space between the lower bumps 240. The lower underfill layer 245 may for example include an insulating polymer material such as an epoxy resin.

The other surface 200SO of the lower semiconductor chip 200 may face the top surface 100U of the lower substrate 100. Conductive pads 230 may be disposed on the other surface 200SO of the lower semiconductor chip 200. In some embodiments, at least one of the plurality of lower semiconductor chips 200 may include lower through-electrodes 250 penetrating therethrough. In other words, the lower through-electrodes 250 may be disposed in at least one of the plurality of lower semiconductor chips 200. Each of the lower through-electrodes 250 may be connected to a corresponding one of the lower chip pads 220 and a corresponding one of the conductive pads 230. The lower through-electrodes 250 may include a conductive material.

The plurality of conductive pillars 280 may be disposed at at least one side of the lower semiconductor chip 200 on the first surface 30051 of the upper substrate 300. In some embodiments, the plurality of conductive pillars 280 may be disposed between the plurality of lower semiconductor chips 200. The conductive pillars 280 may be laterally spaced apart from each other in the first direction D1 on the first surface 300S1 of the upper substrate 300, and each of the conductive pillars 280 may be connected to the first surface 30051 of the upper substrate 300. For example, the conductive pillars 280 may be respectively connected to corresponding ones of the first upper substrate pads 314. The conductive pillars 280 may include a metal (e.g., copper). The conductive pillars 280 may have lengths in the second direction D2. For example, the lengths of the conductive pillars 280 may range from about 20 µm to about 30 µm.

The lower semiconductor chip 200 may be electrically connected to the upper substrate 300 through the lower chip pads 220, the corresponding lower bumps 240, and the corresponding first upper substrate pads 314. The conductive pillars 280 may be electrically connected to the upper substrate 300 through the first upper substrate pads 314 corresponding to the conductive pillars 280. In some embodiments, widths (or a pitch) of the first upper substrate pads 314 connected to the lower semiconductor chip 200 may be different from widths (or a pitch) of the first upper substrate pads 314 connected to the conductive pillars 280. For example, the widths (or the pitch) of the first upper substrate pads 314 connected to the conductive pillars 280 may be greater than the widths (or the pitch) of the first upper substrate pads 314 connected to the lower semiconductor chip 200.

The lower substrate 100 may include first lower substrate pads 110 adjacent to the top surface 100U of the lower substrate 100, and second lower substrate pads 120 adjacent to a bottom surface 100L of the lower substrate 100. The first and second lower substrate pads 110 and 120 may include a conductive material. In some embodiments, the lower substrate 100 may be a printed circuit board (PCB). External terminals 130 may be disposed on the bottom surface 100L of the lower substrate 100 and may be respectively connected to the second lower substrate pads 120. The first lower substrate pads 110 may be electrically connected to the second lower substrate pads 120 through internal interconnection lines (not shown) provided in the lower substrate 100. In the present specification, the lower substrate 100 may also be referred to as a lower structure.

The conductive pads 230 and the conductive pillars 280 may be connected to the first lower substrate pads 110. In some embodiments, connection bumps 260 may be disposed between the conductive pads 230 and corresponding ones of the first lower substrate pads 110, and between the conductive pillars 280 and corresponding ones of the first lower substrate pads 110. Each of the conductive pads 230 and the conductive pillars 280 may be connected to a corresponding one of the first lower substrate pads 110 through a corresponding one of the connection bumps 260. Each of the connection bumps 260 may include a conductive material and may have at least one of a solder ball shape, a bump shape, or a pillar shape.

The lower semiconductor chip 200 may be electrically connected to the lower substrate 100 through the corresponding conductive pads 230, the corresponding connection bumps 260, and the corresponding first lower substrate pads 110. In some embodiments, at least one of the plurality of lower semiconductor chips 200 may include the lower through-electrodes 250, and the at least one of the plurality of lower semiconductor chips 200 may be electrically connected to the lower substrate 100 through the lower through-electrodes 250, the corresponding conductive pads 230, the corresponding connection bumps 260, and the corresponding first lower substrate pads 110. The conductive pillars 280 may be electrically connected to the lower substrate 100 through the corresponding connection bumps 260 and the corresponding first lower substrate pads 110.

A lower mold layer 290 may be disposed between the lower substrate 100 and the upper substrate 300 and may fill a space between the lower semiconductor chip 200 and the conductive pillars 280. The lower mold layer 290 may extend onto the other surface 200SO of the lower semiconductor chip 200 to cover sidewalls of the conductive pads 230. The lower mold layer 290 may include an insulating material (e.g., an epoxy molding compound).

An underfill layer 150 may be disposed between the lower substrate 100 and the lower mold layer 290 and may fill a space between the connection bumps 260. The underfill layer 150 may include an insulating polymer material such as an epoxy resin.

The upper semiconductor chip 400 may be disposed on the second surface 300S2 of the upper substrate 300 and may be connected to the second surface 300S2 of the upper substrate 300. The upper semiconductor chip 400 may vertically overlap with at least a portion of the lower semiconductor chip 200 and/or at least a portion of the conductive pillars 280.

In some embodiments, a plurality of the upper semiconductor chips 400 may be disposed on the second surface 300S2 of the upper substrate 300 and may be laterally spaced apart from each other in the first direction D1. Each of the plurality of upper semiconductor chips 400 may be connected to the second surface 300S2 of the upper substrate 300. The plurality of upper semiconductor chips 400 may be, for example, the same kind of semiconductor chips. In other words, the plurality of upper semiconductor chips 400 may for example be memory chips, logic chips, application processor (AP) chips, or system-on-chips (SOCs). As other examples, the plurality of upper semiconductor chips 400 may include different kinds of semiconductor chips. In other words, the plurality of upper semiconductor chips 400 may include different semiconductor chips selected from a group consisting of a memory chip, a logic chip, an application processor (AP) chip, and a system-on-chip (SOC). In some embodiments, at least one of the plurality of upper semiconductor chips 400 may be a high bandwidth memory (HBM) chip which includes a plurality of memory chips stacked in the second direction D2 perpendicular to the second surface 300S2 of the upper substrate 300.

One surface 400S of the upper semiconductor chip 400 may face the second surface 300S2 of the upper substrate 300. The upper semiconductor chip 400 may include an upper circuit layer 410 adjacent to the one surface 400S of the upper semiconductor chip 400. The upper circuit layer 410 may include integrated circuits.

The upper semiconductor chip 400 may include upper chip pads 420 adjacent to the one surface 400S of the upper semiconductor chip 400. The upper chip pads 420 may include a conductive material. The upper chip pads 420 may be connected to the second upper substrate pads 324. In some embodiments, upper bumps 440 may be disposed between the upper chip pads 420 and the second upper substrate pads 324. Each of the upper chip pads 420 may be connected to corresponding ones of the second upper substrate pads 324 through corresponding ones of the upper bumps 440. Each of the upper bumps 440 may include a conductive material and may have at least one of a solder ball shape, a bump shape, or a pillar shape. In some embodiments, an upper underfill layer 445 may be disposed between the one surface 400S of the upper semiconductor chip 400 and the second surface 300S2 of the upper substrate 300 and may cover the upper bumps 440. The upper underfill layer 445 may be locally disposed on the one surface 400S of the upper semiconductor chip 400 and may fill a space between the upper bumps 440. The upper underfill layer 445 may include an insulating polymer material such as an epoxy resin.

The upper semiconductor chip 400 may be electrically connected to the upper substrate 300 through the upper chip pads 420, corresponding upper bumps 440, and corresponding second upper substrate pads 324. In some embodiments, the upper semiconductor chip 400 may be connected to the metal interconnection lines 322 in the upper substrate 300. The upper semiconductor chip 400 may be electrically connected to the lower semiconductor chip 200 and/or corresponding conductive pillars 280 through the metal interconnection lines 322 and the through-vias 312 in the upper substrate 300, and may be electrically connected to the lower substrate 100 through the lower semiconductor chip 200 and/or the corresponding conductive pillars 280. In some embodiments, the plurality of upper semiconductor chips 400 may be electrically connected to each other through the metal interconnection lines 322.

According to the embodiments of the inventive concepts, the upper semiconductor chip 400 may vertically overlap with at least a portion of the lower semiconductor chip 200 and/or at least a portion of the plurality of conductive pillars 280, and may be connected to the lower semiconductor chip 200 and/or corresponding conductive pillars 280 through the upper substrate 300. In addition, the plurality of upper semiconductor chips 400 may be horizontally stacked on the upper substrate 300 and may be connected to each other through the upper substrate 300. In other words, a plurality of the semiconductor chips 200 and 400 vertically and horizontally stacked may be easily connected to each other through the upper substrate 300 and may be easily connected to the lower substrate 100 through the plurality of conductive pillars 280. As a result, the plurality of semiconductor chips 200 and 400 may be easily mounted on the lower substrate 100, and thus the integration density of the semiconductor package 1000 may be easily improved or increased.

Figure 3:
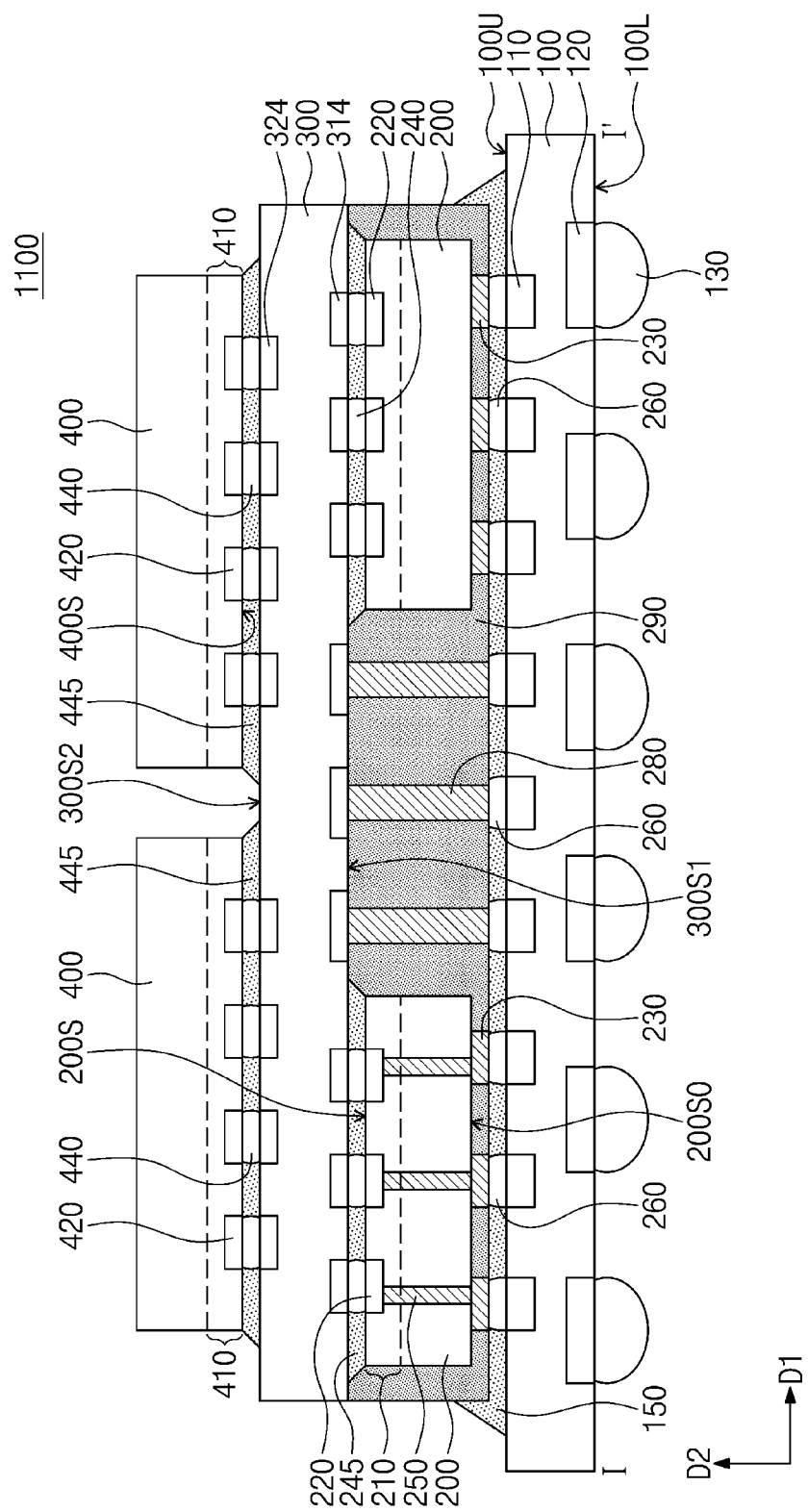
FIG. 3 illustrates a cross-sectional view of a semiconductor package 1100 taken along line I-I' of FIG. 1 according to embodiments of the inventive concepts.

FIG. 3 illustrates a cross-sectional view of a semiconductor package 1100 taken along line I-I' of FIG. 1 according to embodiments of the inventive concepts. Hereinafter, differences between the semiconductor package 1100 of FIG. 3 and the semiconductor package 1000 described with reference to FIGS. 1 and 2 will be mainly described for convenience of explanation and for brevity.

Referring to FIGS. 1 and 3, the upper substrate 300 may include the first upper substrate pads 314 adjacent to the first surface 300S1, and the second upper substrate pads 324 adjacent to the second surface 300S2. In the present embodiments, the upper substrate 300 may be a printed circuit board (PCB). The first upper substrate pads 314 may be electrically connected to the second upper substrate pads 324 through internal interconnection lines (not shown) provided in the upper substrate 300.

The upper semiconductor chip(s) 400 may be electrically connected to the upper substrate 300 through the upper chip pads 420, the corresponding upper bumps 440, and the corresponding second upper substrate pads 324. In the present embodiments, the upper semiconductor chip(s) 400 may be electrically connected to the lower semiconductor chip(s) 200 and/or the corresponding conductive pillars 280 through the corresponding second upper substrate pads 324 and the first upper substrate pads 314 connected thereto. In some embodiments, the plurality of upper semiconductor chips 400 may be electrically connected to each other through corresponding second upper substrate pads 324.

Figure 4:
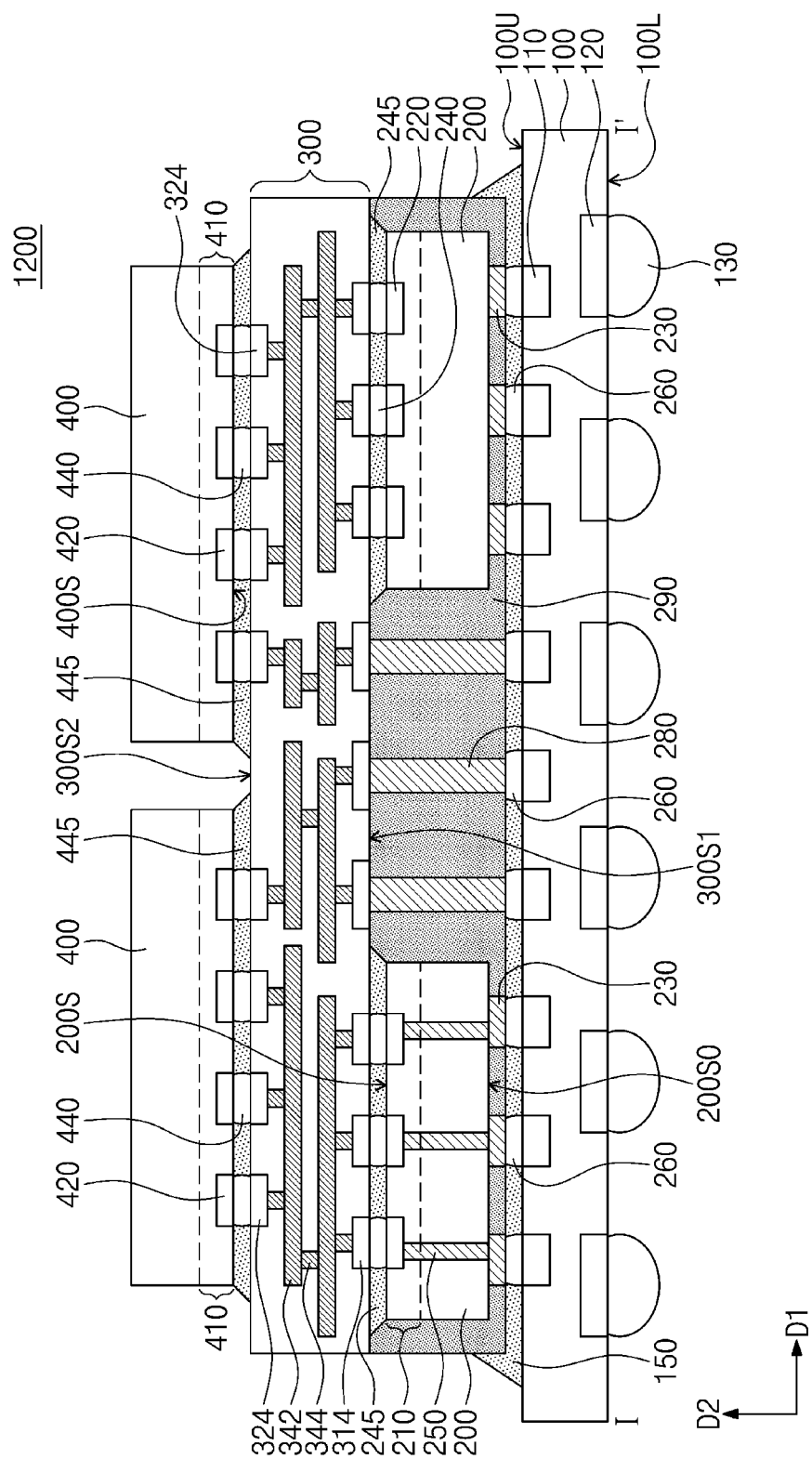
FIG. 4 illustrates a cross-sectional view of a semiconductor package 1200 taken along line I-I' of FIG. 1 according to embodiments of the inventive concepts.

FIG. 4 illustrates a cross-sectional view of a semiconductor package 1200 taken along line I-I' of FIG. 1 according to embodiments of the inventive concepts. Hereinafter, differences between the semiconductor package 1200 of FIG. 4 and the semiconductor package 1000 described with reference to FIGS. 1 and 2 will be mainly described for convenience of explanation and for brevity.

Referring to FIGS. 1 and 4, the upper substrate 300 may include the first upper substrate pads 314 adjacent to the first surface 300S1, and the second upper substrate pads 324 adjacent to the second surface 300S2. In the present embodiments, the upper substrate 300 may be a redistribution substrate. The upper substrate 300 may include redistribution patterns 342 and 344. The redistribution patterns 342 and 344 may include redistribution lines 342 and redistribution contacts 344 disposed between the redistribution lines 342. The redistribution patterns 342 and 344 may include a conductive material. The first upper substrate pads 314 may be electrically connected to the second upper substrate pads 324 through the redistribution patterns 342 and 344.

The upper semiconductor chip(s) 400 may be electrically connected to the upper substrate 300 through the upper chip pads 420, the corresponding upper bumps 440, and the corresponding second upper substrate pads 324. In the present embodiments, the upper semiconductor chip(s) 400 may be electrically connected to the lower semiconductor chip(s) 200 and/or the corresponding conductive pillars 280 through the redistribution patterns 342 and 344 and the first upper substrate pads 314, which are connected to the corresponding second upper substrate pads 324. In some embodiments, the plurality of upper semiconductor chips 400 may be electrically connected to each other through corresponding second upper substrate pads 324 and the redistribution patterns 342 and 344 connected thereto.

Figure 5:
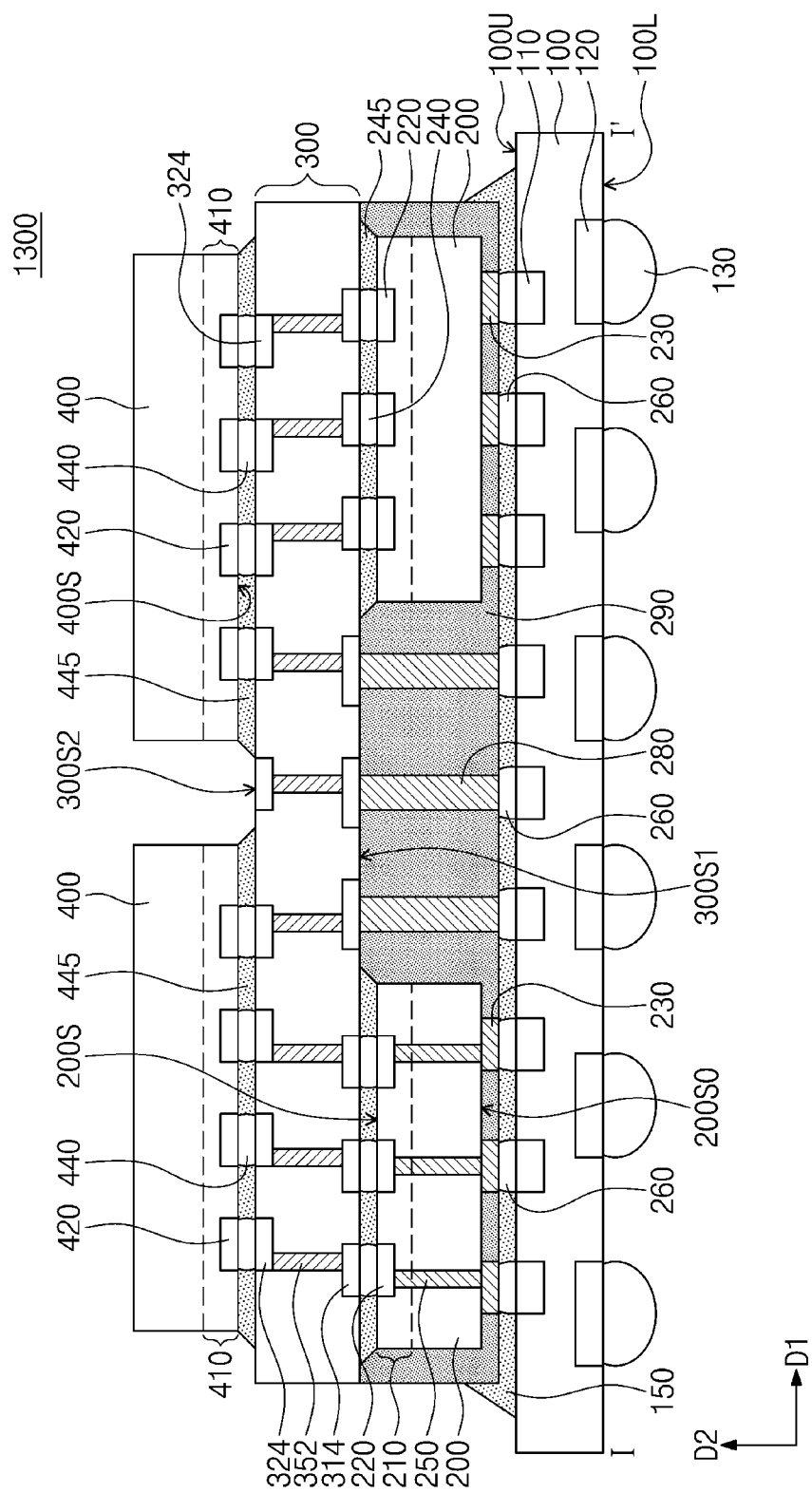
FIG. 5 illustrates a cross-sectional view of a semiconductor package 1300 taken along line I-I' of FIG. 1 according to embodiments of the inventive concepts.

FIG. 5 illustrates a cross-sectional view of a semiconductor package 1300 taken along line I-I' of FIG. 1 according to embodiments of the inventive concepts. Hereinafter, differences between the semiconductor package 1300 of FIG. 5 and the semiconductor package 1000 described with reference to FIGS. 1 and 2 will be mainly described for convenience of explanation and for brevity.

Referring to FIGS. 1 and 5, the upper substrate 300 may include the first upper substrate pads 314 adjacent to the first surface 300S1, and the second upper substrate pads 324 adjacent to the second surface 300S2. In the present embodiments, the upper substrate 300 may be a semiconductor chip. The upper substrate 300 may include upper through-electrodes 352 penetrating the upper substrate 300, and the upper through-electrodes 352 may include a conductive material. The first upper substrate pads 314 may be electrically connected to the second upper substrate pads 324 through the upper through-electrodes 352.

The upper semiconductor chip(s) 400 may be electrically connected to the upper substrate 300 through the upper chip pads 420, the corresponding upper bumps 440, and the corresponding second upper substrate pads 324. In the present embodiments, the upper semiconductor chip(s) 400 may be electrically connected to the lower semiconductor chip(s) 200 and/or corresponding conductive pillars 280 through the upper through-electrodes 352 and the first upper substrate pads 314, which are connected to the corresponding second upper substrate pads 324. In some embodiments, the plurality of upper semiconductor chips 400 may be electrically connected to each other through corresponding second upper substrate pads 324 and the upper through-electrodes 352 connected thereto.

Figure 6:
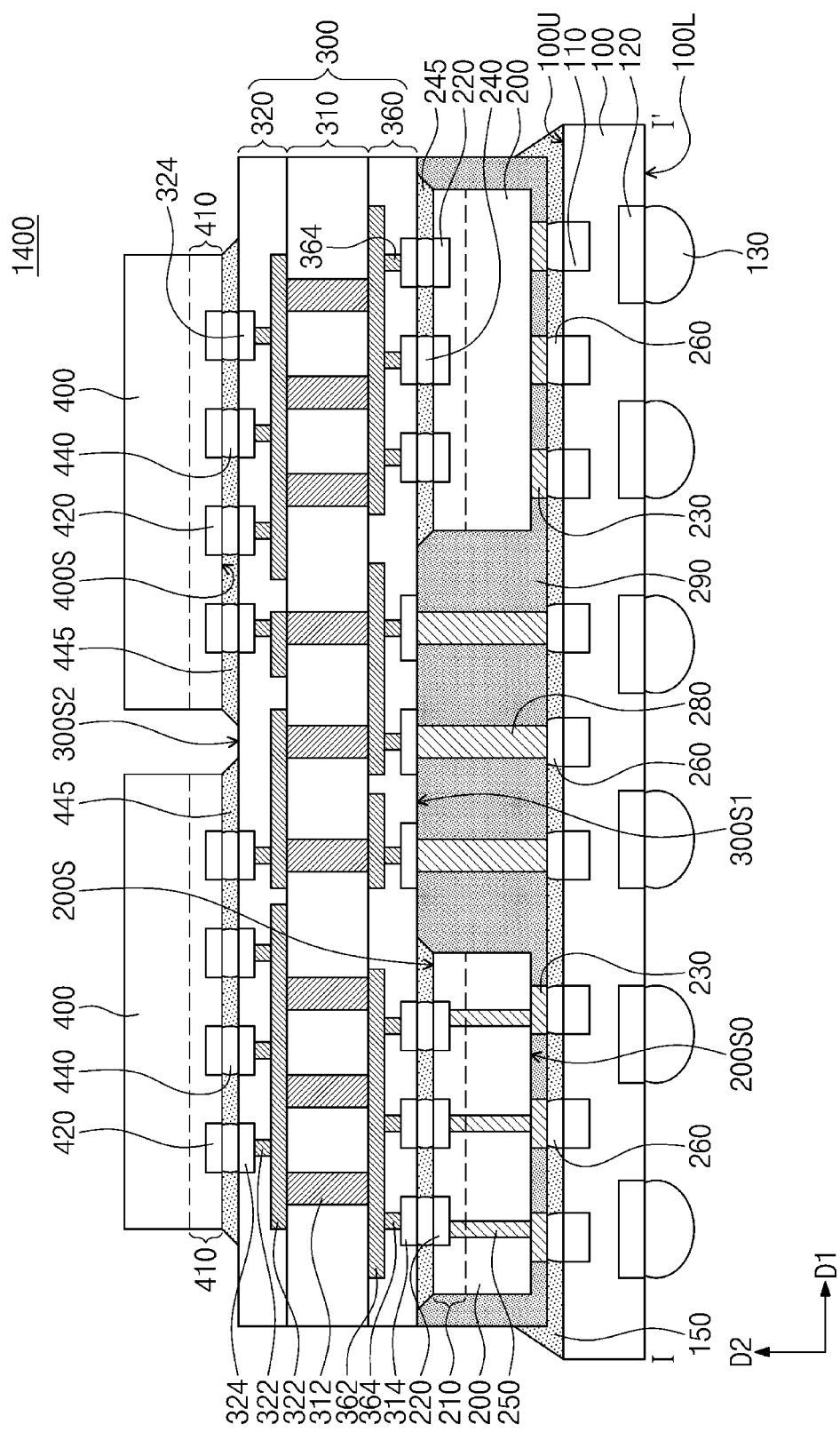
FIG. 6 illustrates a cross-sectional view of a semiconductor package 1400 taken along line I-I' of FIG. 1 according to embodiments of the inventive concepts.

FIG. 6 illustrates a cross-sectional view of a semiconductor package 1400 taken along line I-I' of FIG. 1 according to embodiments of the inventive concepts. Hereinafter, differences between the semiconductor package 1400 of FIG. 6 and the semiconductor package 1000 described with reference to FIGS. 1 and 2 will be mainly described for convenience of explanation and for brevity.

Referring to FIGS. 1 and 6, the upper substrate 300 may include the first upper substrate pads 314 adjacent to the first surface 300S1, and the second upper substrate pads 324 adjacent to the second surface 300S2. In the present embodiments, the upper substrate 300 may include an upper redistribution layer 360 disposed adjacent to the first surface 300S1 of the upper substrate 300. The upper redistribution layer 360 may include upper redistribution lines 362 and upper redistribution contacts 364 connected thereto. The upper redistribution lines 362 and the upper redistribution contacts 364 may include a conductive material. The upper redistribution lines 362 and the upper redistribution contacts 364 may be connected to the first upper substrate pads 314.

In some embodiments, the upper substrate 300 may be a silicon interposer substrate described with reference to FIG. 2 and may further include the through-via layer 310 and the metal interconnection layer 320. In this case, the through-via layer 310 may be disposed between the metal interconnection layer 320 and the upper redistribution layer 360. The upper redistribution lines 362 and the upper redistribution contacts 364 may be connected to the through-vias 312 in the through-via layer 310. The first upper substrate pads 314 may be electrically connected to the second upper substrate pads 324 through the upper redistribution lines 362, the upper redistribution contacts 364, the through-vias 312, and the metal interconnection lines 322.

In certain embodiments, the upper substrate 300 may include the printed circuit board described with reference to FIG. 3 or the semiconductor chip described with reference to FIG. 5. In this case, in contrast to FIG. 6, the first upper substrate pads 314 may be electrically connected to the second upper substrate pads 324 through the upper redistribution lines 362, the upper redistribution contacts 364, and internal interconnection lines (e.g., the internal interconnection lines (not shown) of FIG. 3 or the upper through-electrodes 352 of FIG. 5) provided in the upper substrate 300.

The upper semiconductor chip(s) 400 may be electrically connected to the upper substrate 300 through the upper chip pads 420, the corresponding upper bumps 440, and the corresponding second upper substrate pads 324. In the present embodiments, the upper semiconductor chip(s) 400 may be electrically connected to the lower semiconductor chip(s) 200 and/or the corresponding conductive pillars 280 through the internal interconnection lines (e.g., the metal interconnection lines 322 and the through-vias 312 of FIG. 2, the internal interconnection lines (not shown) of FIG. 3, or the upper through-electrodes 352 of FIG. 5) in the upper substrate 300, the upper redistribution lines 362, and the upper redistribution contacts 364. In addition, the upper semiconductor chip(s) 400 may be electrically connected to the lower substrate 100 through the lower semiconductor chip(s) 200 and/or the corresponding conductive pillars 280. In some embodiments, the plurality of lower semiconductor chips 200 may be electrically connected to each other through corresponding first upper substrate pads 314, the upper redistribution lines 362 and the upper redistribution contacts 364, which are connected to each other.

Figure 7:
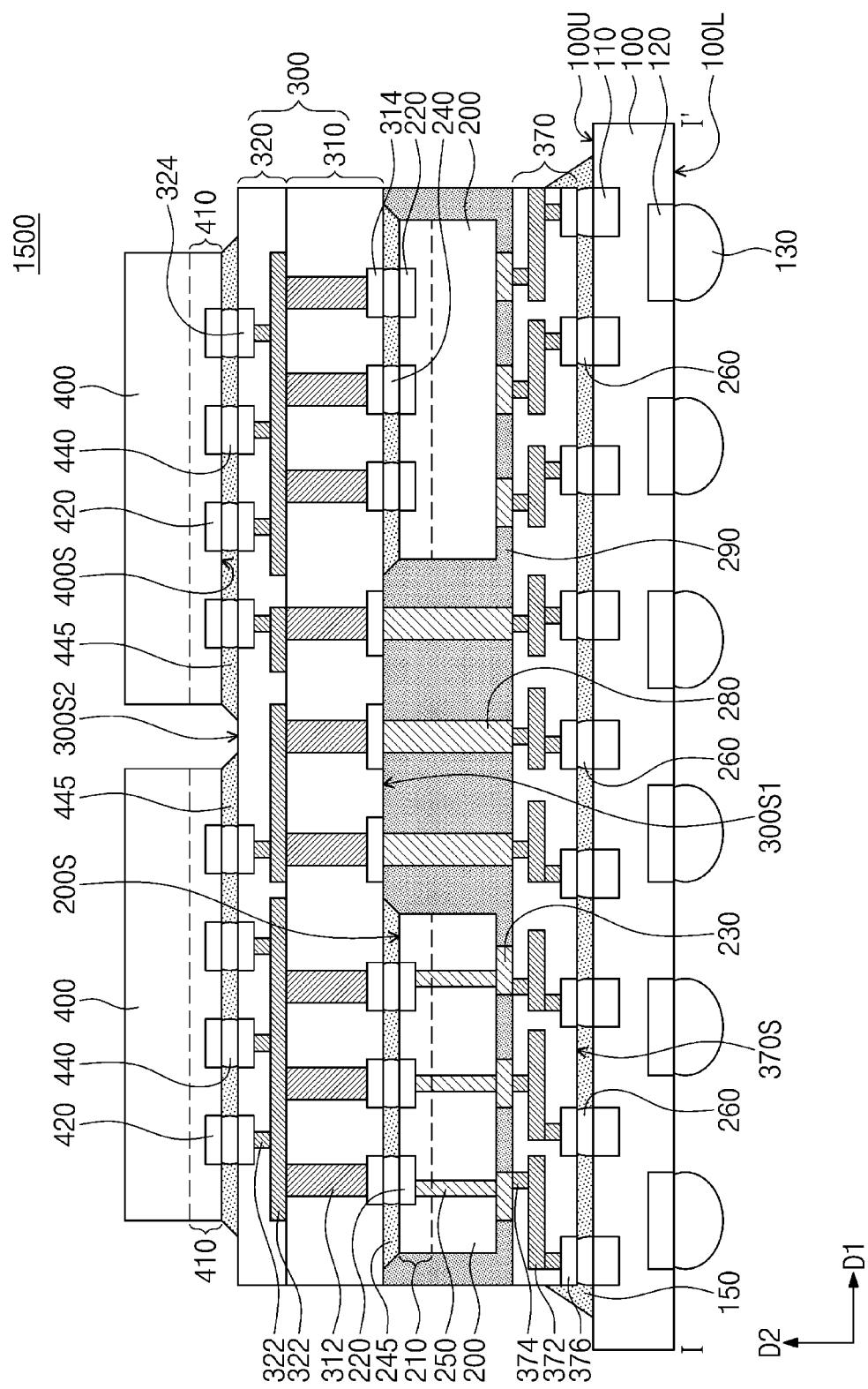
FIG. 7 illustrates a cross-sectional view of a semiconductor package 1500 taken along line I-I' of FIG. 1 according to embodiments of the inventive concepts.

FIG. 7 illustrates a cross-sectional view of a semiconductor package 1500 taken along line I-I' of FIG. 1 according to embodiments of the inventive concepts. Hereinafter, differences between the semiconductor package 1500 of FIG. 7 and the semiconductor package 1000 described with reference to FIGS. 1 and 2 will be mainly described for convenience of explanation and for brevity.

Referring to FIGS. 1 and 7, the semiconductor package 1500 may further include a lower redistribution layer 370 disposed between the lower substrate 100 and the lower semiconductor chip(s) 200, and between the lower substrate 100 and the plurality of conductive pillars 280. The lower redistribution layer 370 may include lower redistribution lines 372 and lower redistribution contacts 374 connected thereto. The lower redistribution lines 372 and the lower redistribution contacts 374 may include a conductive material. One surface 370S of the lower redistribution layer 370 may face the top surface 100U of the lower substrate 100. The lower redistribution layer 370 may further include redistribution pads 376 adjacent to the one surface 370S of the lower redistribution layer 370. The lower redistribution lines 372 and the lower redistribution contacts 374 may be connected to the redistribution pads 376.

The lower semiconductor chip(s) 200 and the conductive pillars 280 may be electrically connected to the lower substrate 100 through the lower redistribution layer 370. For example, the conductive pads 230 and the conductive pillars 280 may be connected to the lower redistribution lines 372 and the lower redistribution contacts 374 in the lower redistribution layer 370, and the redistribution pads 376 may be connected to the first lower substrate pads 110 of the lower substrate 100. The connection bumps 260 may be disposed between the redistribution pads 376 and the first lower substrate pads 110, and each of the redistribution pads 376 may be connected to a corresponding one of the first lower substrate pads 110 through a corresponding one of the connection bumps 260. The underfill layer 150 may be disposed between the lower substrate 100 and the lower redistribution layer 370 and may fill a space between the connection bumps 260. The lower mold layer 290 may be disposed between the lower redistribution layer 370 and the upper substrate 300 and may fill a space between the lower semiconductor chip(s) 200 and the conductive pillars 280.

FIGS. 8 to 11 illustrate cross-sectional views taken along line I-I' of FIG. 1 descriptive of a method of manufacturing a semiconductor package, according to embodiments of the inventive concepts. Description of the same features as in semiconductor packages 1000, 1100, 1200, 1300, 1400 and 1500 described with reference to FIGS. 1 to 7 will be omitted from the following for convenience and brevity.

Figure 8:
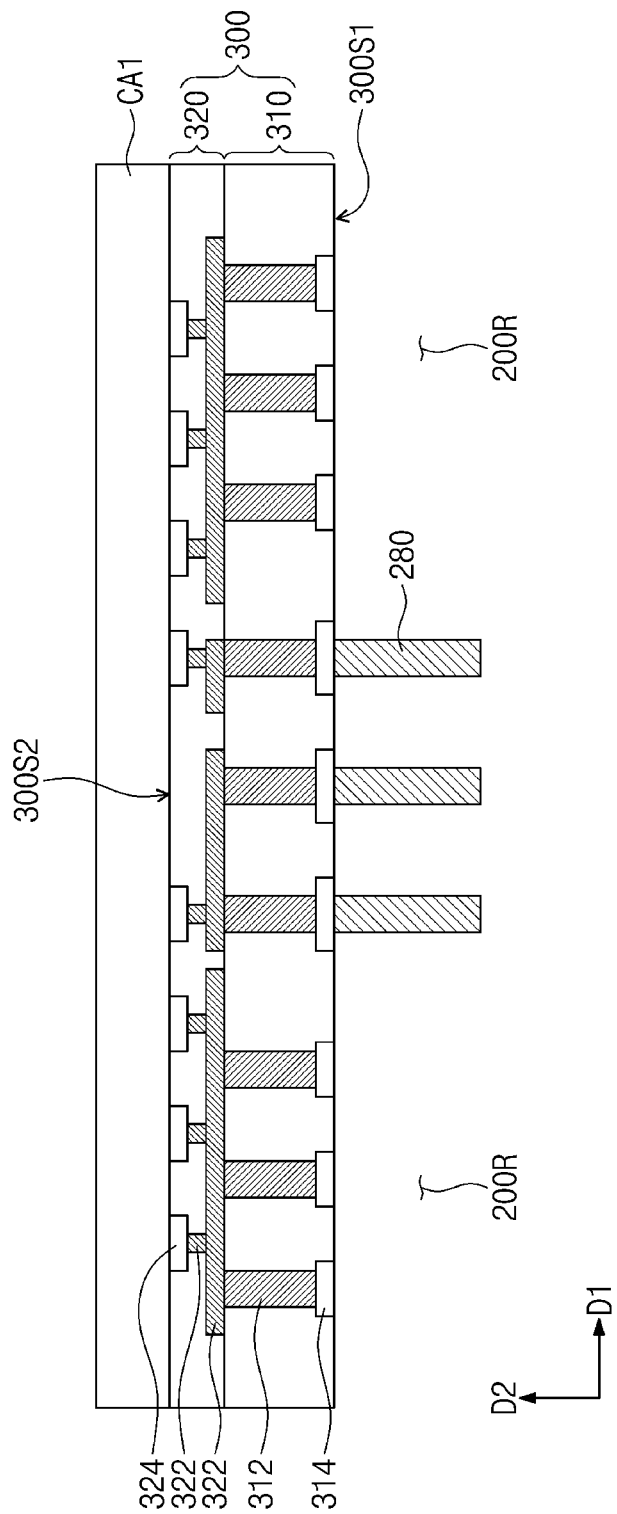
FIGS. 8, 9, 10 and 11 illustrate cross-sectional views taken along line I-I' of FIG. 1 descriptive of a method of manufacturing a semiconductor package, according to embodiments of the inventive concepts.

Referring to FIGS. 1 and 8, an upper substrate 300 may be provided on a first carrier substrate CA1 The upper substrate 300 may have a first surface 300S1 and a second surface 300S2 which are opposite to each other. The upper substrate 300 may be provided on the first carrier substrate CA1 in such a way that the second surface 300S2 faces the first carrier substrate CA1 The upper substrate 300 may include first upper substrate pads 314 adjacent to the first surface 300S1, and second upper substrate pads 324 adjacent to the second surface 300S2. Hereinafter, a case in which the upper substrate 300 is the silicon interposer substrate of FIG. 2 will be described as an example for the purpose of ease and convenience of explanation. However, embodiments of the inventive concepts are not limited thereto, and in some embodiments the upper substrate 300 may be the printed circuit board of FIG. 3, the redistribution substrate of FIG. 4, or the semiconductor chip of FIG. 5.

The upper substrate 300 may include a through-via layer 310 and a metal interconnection layer 320. The metal interconnection layer 320 may include metal interconnection lines 322 disposed adjacent to the second surface 300S2 of the upper substrate 300, and the through-via layer 310 may include through-vias 312 connected to the metal interconnection lines 322. The through-vias 312 may extend (e.g., vertically extend) from the metal interconnection lines 322 toward the first surface 300S1 of the upper substrate 300. In some embodiments, as described with reference to FIG. 6, the upper substrate 300 may further include the upper redistribution layer 360 disposed adjacent to the first surface 300S1 of the upper substrate 300.

A plurality of conductive pillars 280 may be formed on the first surface 300S1 of the upper substrate 300. A chip mounting region 200R may be defined in advance on the first surface 300S1 of the upper substrate 300, and the conductive pillars 280 may be formed on the first surface 300S1 of the upper substrate 300 other than the chip mounting region 200R. The conductive pillars 280 may be connected to corresponding ones of the first upper substrate pads 314, respectively. The conductive pillars 280 may be formed using, for example, an electroplating process. For example, the formation of the conductive pillars 280 may include forming a photoresist pattern having openings exposing regions at which the conductive pillars 280 will be formed on the first surface 300S1 of the upper substrate 300, forming a seed layer on the photoresist pattern, and forming the conductive pillars 280 by performing the electroplating process on the seed layer. The photoresist pattern may be removed after the formation of the conductive pillars 280.

Figure 9:
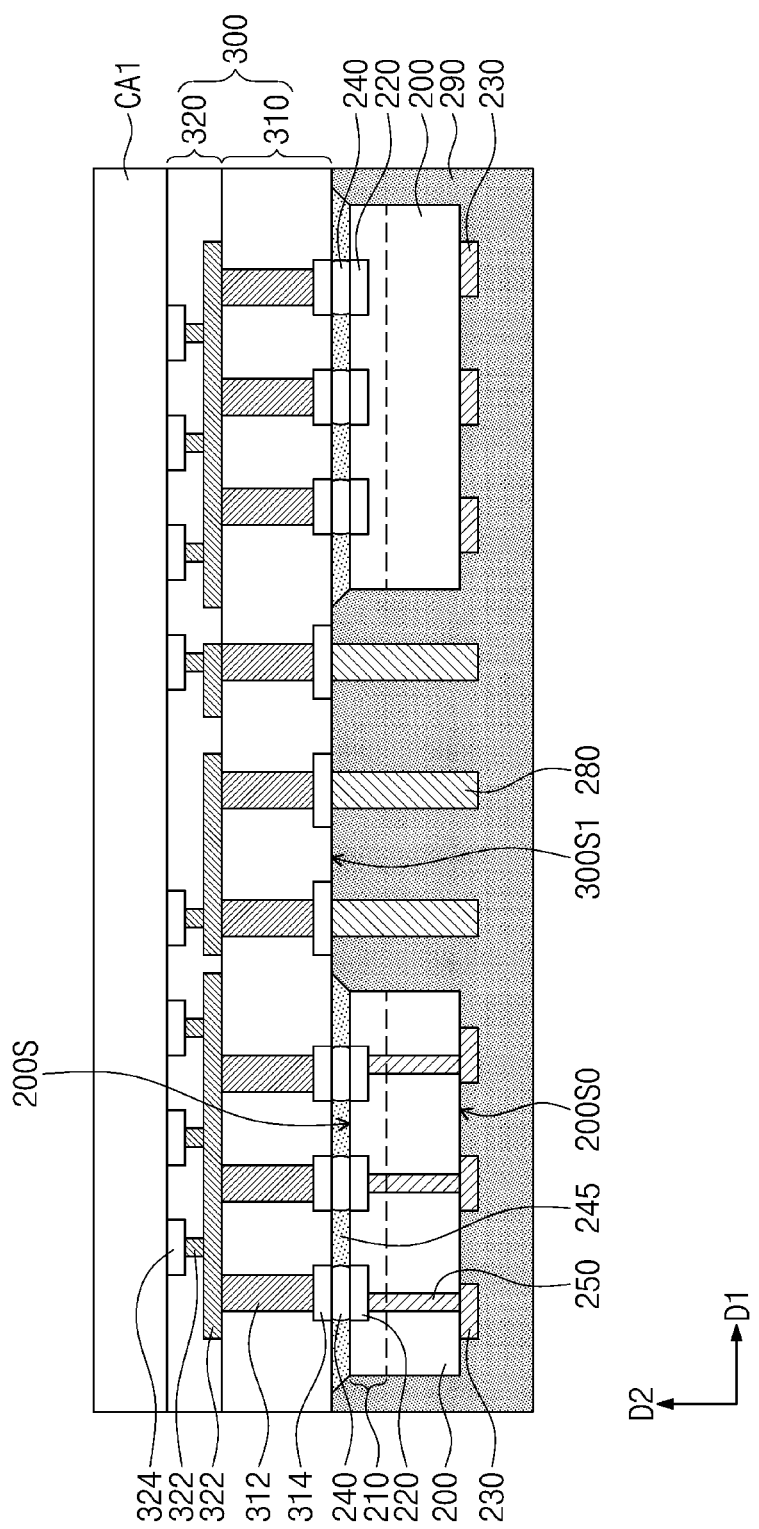

Referring to FIGS. 1 and 9, lower bumps 240 may be formed on the first surface 300S1 of the upper substrate 300 in the chip mounting region 200R. The lower bumps 240 may be formed on corresponding ones of the first upper substrate pads 314, respectively, and may be connected to the corresponding first upper substrate pads 314, respectively.

A lower semiconductor chip 200 may be mounted in the chip mounting regions 200R. The lower semiconductor chip 200 may include lower chip pads 220, and the lower chip pads 220 may be disposed adjacent to one surface 200S of the lower semiconductor chip 200. The lower semiconductor chip 200 may be provided on the first surface 300S1 of the upper substrate 300 in such a way that the lower chip pads 220 are in contact with the lower bumps 240, respectively. The lower semiconductor chip 200 may include a lower circuit layer 210 adjacent to, for example, the one surface 200S of the lower semiconductor chip 200. Alternatively, in contrast to FIG. 9, the lower circuit layer 210 may be disposed adjacent to another surface 200SO of the lower semiconductor chip 200. Conductive pads 230 may be formed on the other surface 200SO of the lower semiconductor chip 200.

In some embodiments, a plurality of the lower semiconductor chips 200 may be mounted on the first surface 300S1 of the upper substrate 300 and may be horizontally spaced apart from each other. At least one of the plurality of lower semiconductor chips 200 may include lower through-electrodes 250 penetrating therethrough. Each of the lower through-electrodes 250 may be connected to a corresponding one of the lower chip pads 220 and a corresponding one of the conductive pads 230.

A lower underfill layer 245 may be formed between the one surface 200S of the lower semiconductor chip 200 and the first surface 300S1 of the upper substrate 300 and may be formed to fill a space between the lower bumps 240. A lower mold layer 290 may be formed on the first surface 300S1 of the upper substrate 300 and may cover the lower semiconductor chip(s) 200, the conductive pillars 280, and the conductive pads 230.

Figure 10:
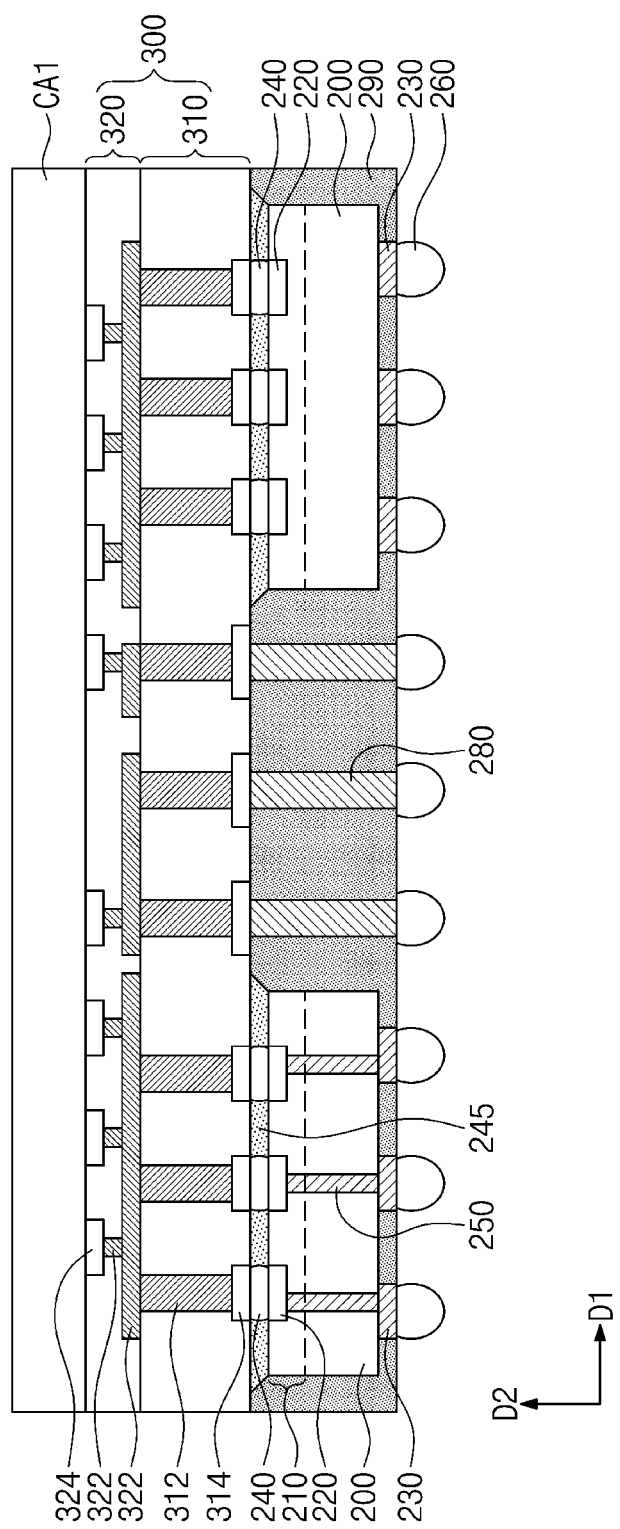

Referring to FIGS. 1 and 10, a portion of the lower mold layer 290 may be removed by performing a grinding process on the lower mold layer 290. One surface of each of the conductive pillars 280 and one surface of each of the conductive pads 230 may be exposed by the grinding process. Connection bumps 260 may be formed on the lower mold layer 290. The connection bumps 260 may be formed on the conductive pillars 280 and the conductive pads 230, respectively, and may be connected to the conductive pillars 280 and the conductive pads 230, respectively. In some embodiments, before the formation of the connection bumps 260, the lower redistribution layer 370 described with reference to FIG. 7 may be formed on the lower mold layer 290. In this case, the connection bumps 260 may be formed on the lower redistribution layer 370 and may be connected to the redistribution pads 376 of the lower redistribution layer 370.

Figure 11:
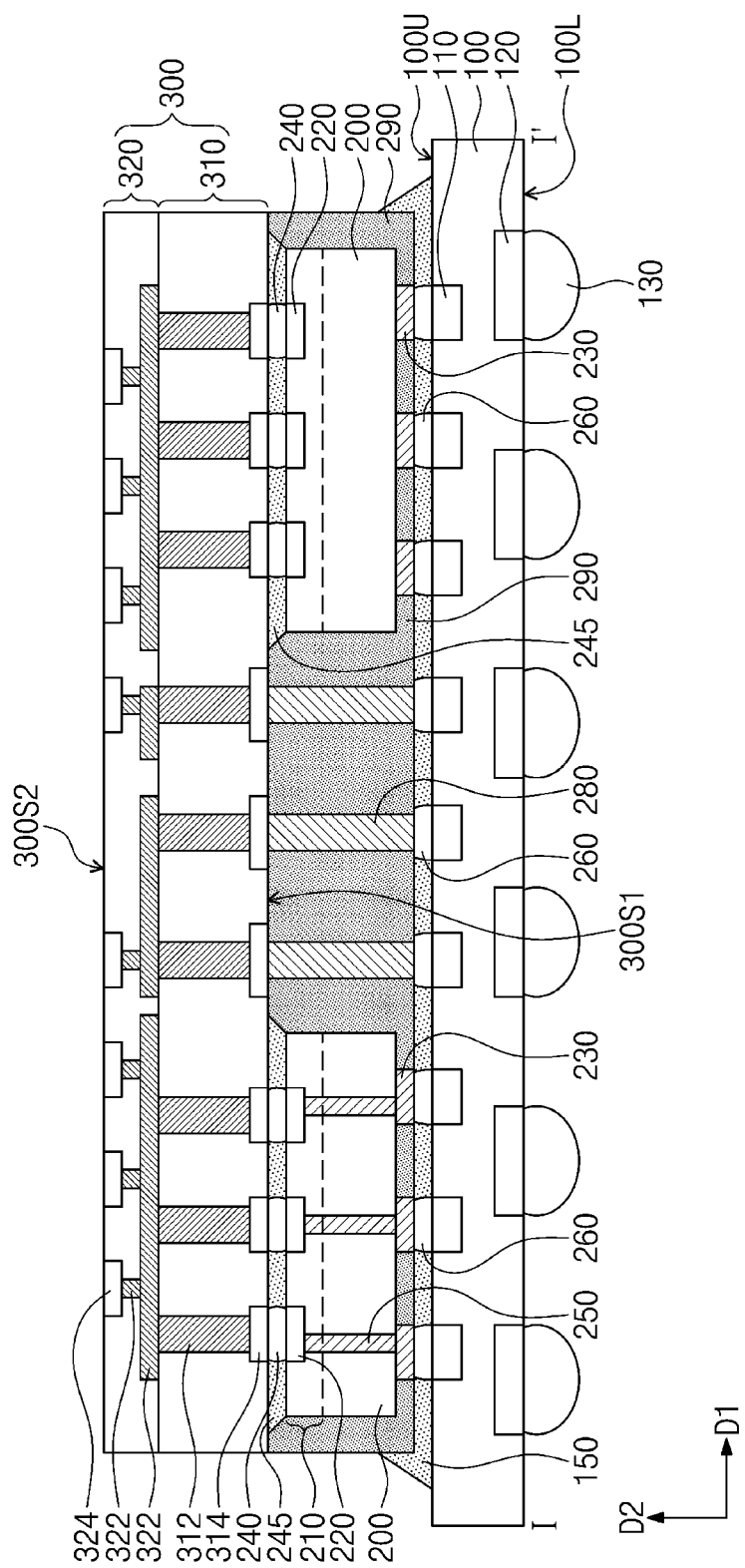

Referring to FIGS. 1 and 11, the aforementioned stack structure formed on the first carrier substrate CA1 may be mounted on a lower substrate 100. The lower substrate 100 may be, for example, a printed circuit board (PCB). The lower substrate 100 may include first lower substrate pads 110 adjacent to a top surface 100U of the lower substrate 100, and second lower substrate pads 120 adjacent to a bottom surface 100L of the lower substrate 100. The aforementioned stack structure may be provided on the top surface 100U of the lower substrate 100 in such a way that the connection bumps 260 are in contact with corresponding ones of the first lower substrate pads 110.

An underfill layer 150 may be formed between the lower substrate 100 and the lower mold layer 290 and may be formed to fill a space between the connection bumps 260.

External terminals 130 may be disposed on the bottom surface 100L of the lower substrate 100 and may be connected to the second lower substrate pads 120, respectively. The first carrier substrate CA1 may be removed after the aforementioned stack structure is mounted on the lower substrate 100.

Referring again to FIGS. 1 and 2, upper bumps 440 may be formed on the second surface 300S2 of the upper substrate 300. The upper bumps 440 may be formed on corresponding ones of the second upper substrate pads 324, respectively, and may be connected to the corresponding second upper substrate pads 324, respectively.

An upper semiconductor chip 400 may be mounted on the second surface 300S2 of the upper substrate 300. The upper semiconductor chip 400 may include upper chip pads 420, and the upper chip pads 420 may be disposed adjacent to one surface 400S of the upper semiconductor chip 400. The upper semiconductor chip 400 may be provided on the second surface 300S2 of the upper substrate 300 in such a way that the upper chip pads 420 are in contact with the upper bumps 440, respectively. The upper semiconductor chip 400 may include an upper circuit layer 410 adjacent to, for example, the one surface 400S of the upper semiconductor chip 400.

The upper semiconductor chip 400 may vertically overlap with at least a portion of the lower semiconductor chip 200 and/or at least a portion of the plurality of conductive pillars 280. In some embodiments, a plurality of the upper semiconductor chips 400 may be mounted on the second surface 300S2 of the upper substrate 300 and may be horizontally spaced apart from each other.

An upper underfill layer 445 may be formed between the one surface 400S of the upper semiconductor chip 400 and the second surface 300S2 of the upper substrate 300 and may be formed to fill a space between the upper bumps 440.

Figure 12:
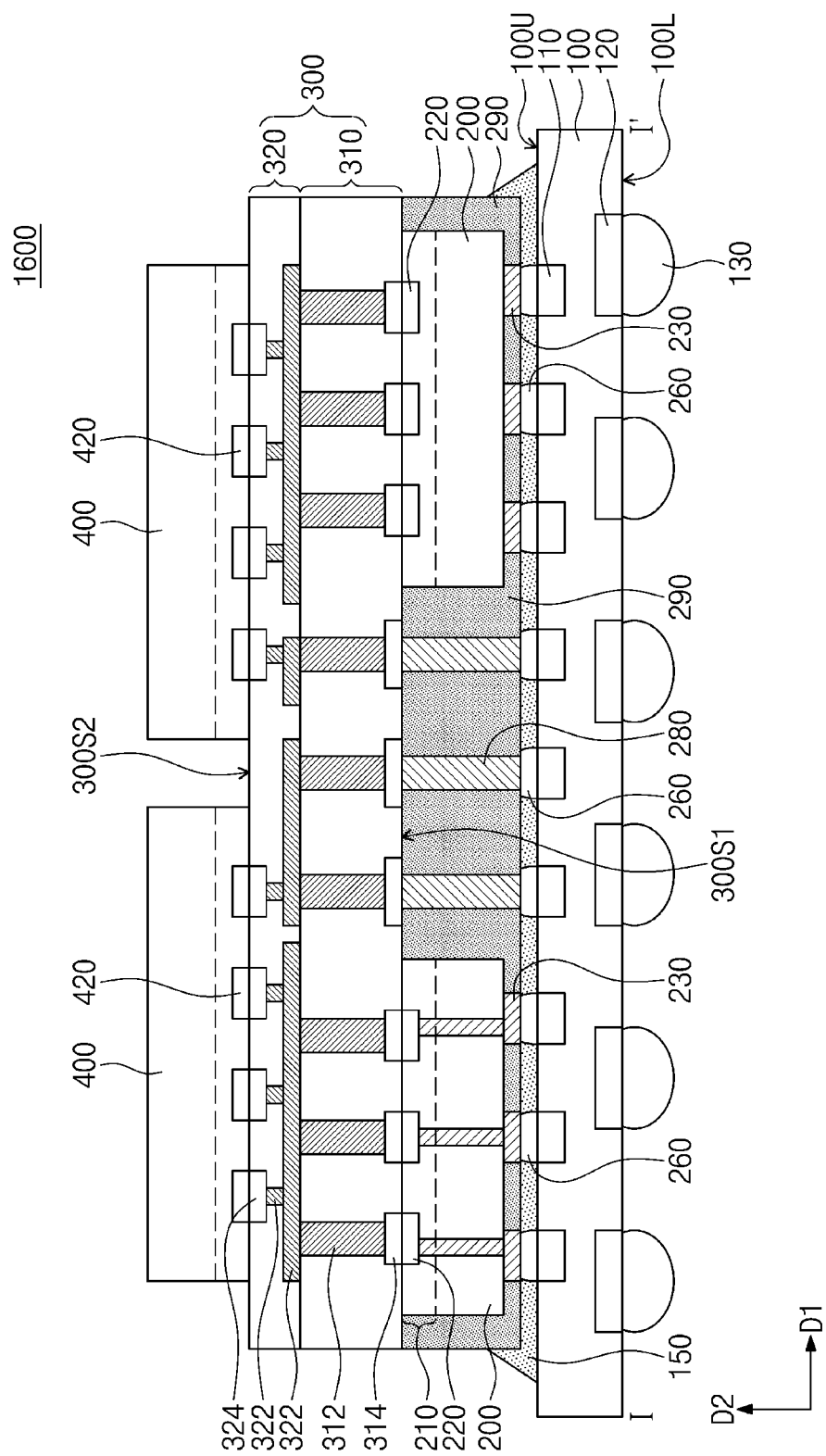
FIG. 12 illustrates a cross-sectional view of a semiconductor package 1600 taken along line I-I' of FIG. 1 according to embodiments of the inventive concepts.

FIG. 12 illustrates a cross-sectional view of a semiconductor package 1600 taken along line I-I' of FIG. 1 according to embodiments of the inventive concepts. Hereinafter, differences between the semiconductor package 1600 of FIG. 12 and the semiconductor package 1000 described with reference to FIGS. 1 and 2 will be mainly described for convenience of explanation and for brevity.

Referring to FIGS. 1 and 12, the lower chip pads 220 of the lower semiconductor chip(s) 200 may be bonded directly to corresponding first upper substrate pads 314 of the upper substrate 300. The lower chip pads 220 may be in contact with the corresponding first upper substrate pads 314. In the present embodiments, the lower bumps 240 and the lower underfill layer 245 described with reference to FIGS. 1 and 2 may be omitted. In addition, the upper chip pads 420 of the upper semiconductor chip(s) 400 may be bonded directly to corresponding second upper substrate pads 324 of the upper substrate 300. The upper chip pads 420 may be in contact with the corresponding second upper substrate pads 324. In the present embodiments, the upper bumps 440 and the upper underfill layer 445 described with reference to FIGS. 1 and 2 may be omitted.

Figure 13:
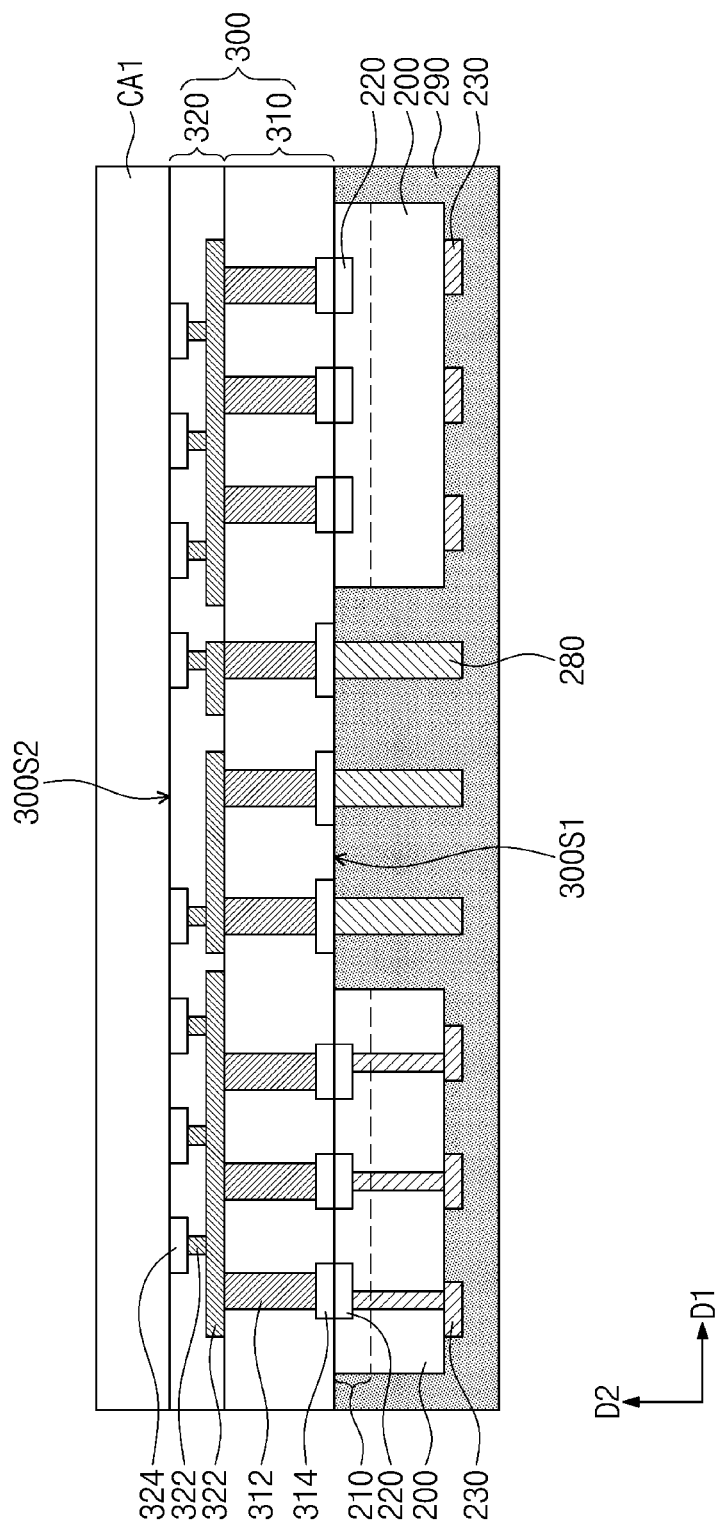
FIG. 13 illustrates a cross-sectional view taken along line I-I' of FIG. 1 descriptive of a method of manufacturing a semiconductor package, according to embodiments of the inventive concepts.

FIG. 13 illustrates a cross-sectional view taken along line I-I' of FIG. 1 descriptive of a method of manufacturing a semiconductor package, according to embodiments of the inventive concepts. Hereinafter, differences between the present embodiment of FIGS. 12 and 13 and the above embodiments described with reference to FIGS. 8 to 11 will be mainly described for convenience and brevity.

First, as described with reference to FIGS. 1 and 8, the upper substrate 300 may be provided on the first carrier substrate CA1, and the plurality of conductive pillars 280 may be formed on the first surface 300S1 of the upper substrate 300 other than the chip mounting region 200R.

Referring to FIGS. 1 and 13, the lower semiconductor chip(s) 200 may be mounted in the chip mounting region 200R. In the present embodiment, the lower semiconductor chip(s) 200 may be provided on the first surface 300S1 of the upper substrate 300 in such a way that the lower chip pads 220 are in direct contact with corresponding first upper substrate pads 314 of the upper substrate 300. The lower chip pads 220 of the lower semiconductor chip(s) 200 may be bonded directly to the corresponding first upper substrate pads 314 by a thermal treatment process. The lower mold layer 290 may be formed on the first surface 300S1 of the upper substrate 300 and may cover the lower semiconductor chip(s) 200, the conductive pillars 280, and the conductive pads 230. Thereafter, as described with reference to FIGS. 1 and 10, a portion of the lower mold layer 290 may be removed by performing the grinding process on the lower mold layer 290. One surface of each of the conductive pillars 280 and one surface of each of the conductive pads 230 may be exposed by the grinding process. The connection bumps 260 may be formed on the conductive pillars 280 and the conductive pads 230, respectively.

Referring again to FIGS. 1 and 12, the aforementioned stack structure formed on the first carrier substrate CA1 may be mounted on the lower substrate 100. The first carrier substrate CA1 may be removed after the aforementioned stack structure is mounted on the lower substrate 100.

The upper semiconductor chip(s) 400 may be mounted on the second surface 300S2 of the upper substrate 300. In the present embodiment, the upper semiconductor chip(s) 400 may be provided on the second surface 300S2 of the upper substrate 300 in such a way that the upper chip pads 420 are in direct contact with corresponding second upper substrate pads 324 of the upper substrate 300. The upper chip pads 420 of the upper semiconductor chip 400 may be bonded directly to the corresponding second upper substrate pads 324 by a thermal treatment process.

Figure 14:
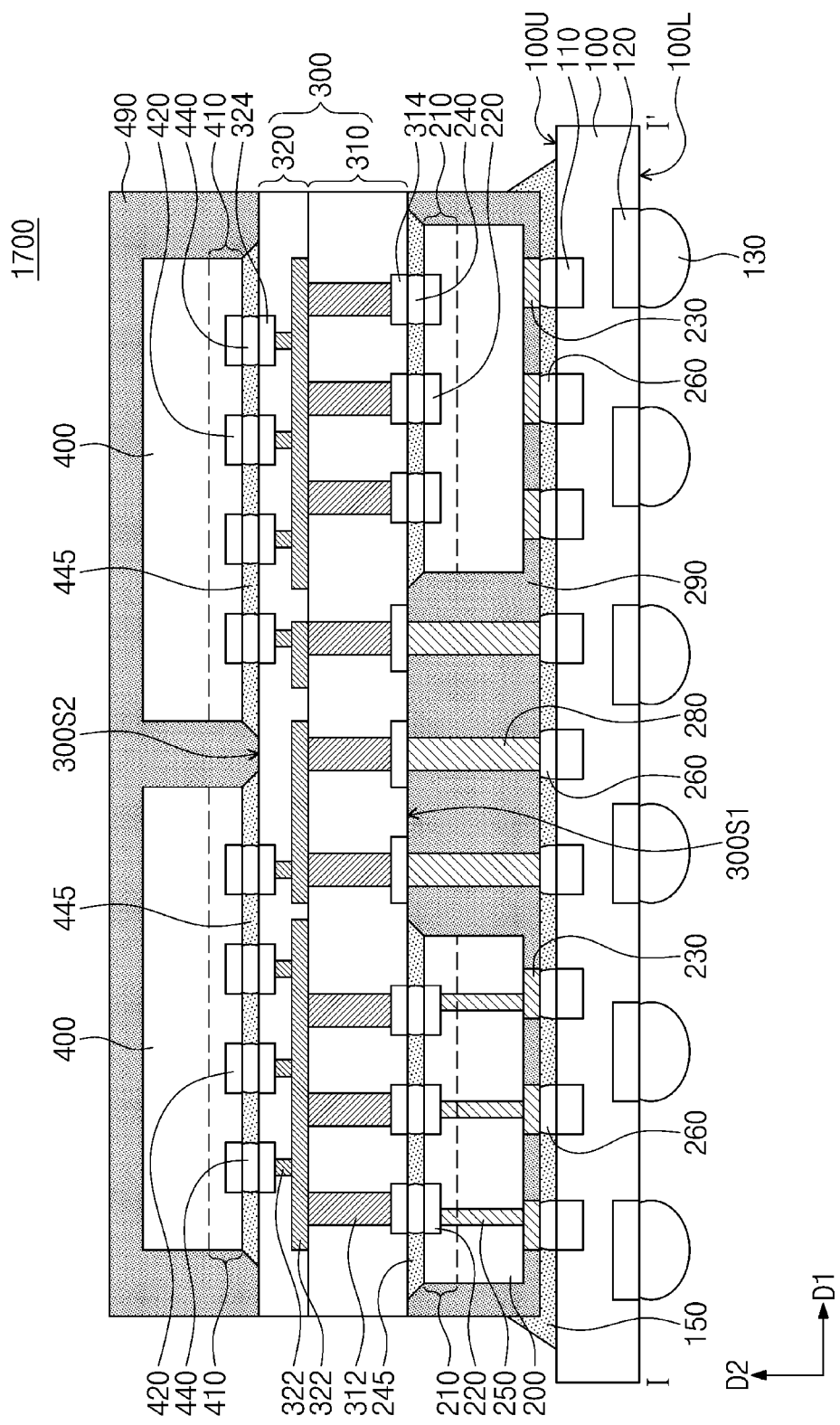
FIG. 14 illustrates a cross-sectional view of a semiconductor package 1700 taken along line I-I' of FIG. 1 according to embodiments of the inventive concepts.

FIG. 14 illustrates a cross-sectional view of a semiconductor package 1700 taken along line I-I' of FIG. 1 according to embodiments of the inventive concepts. Hereinafter, differences between the semiconductor package 1700 of FIG. 14 and the semiconductor package 1000 described with reference to FIGS. 1 and 2 will be mainly described for convenience of explanation and for brevity.

Referring to FIGS. 1 and 14, the semiconductor package 1700 may further include an upper mold layer 490 disposed on the second surface 300S2 of the upper substrate 300. The upper mold layer 490 may cover the upper semiconductor chip 400. The upper mold layer 490 may include an insulating material (e.g., an epoxy molding compound).

Figure 15:
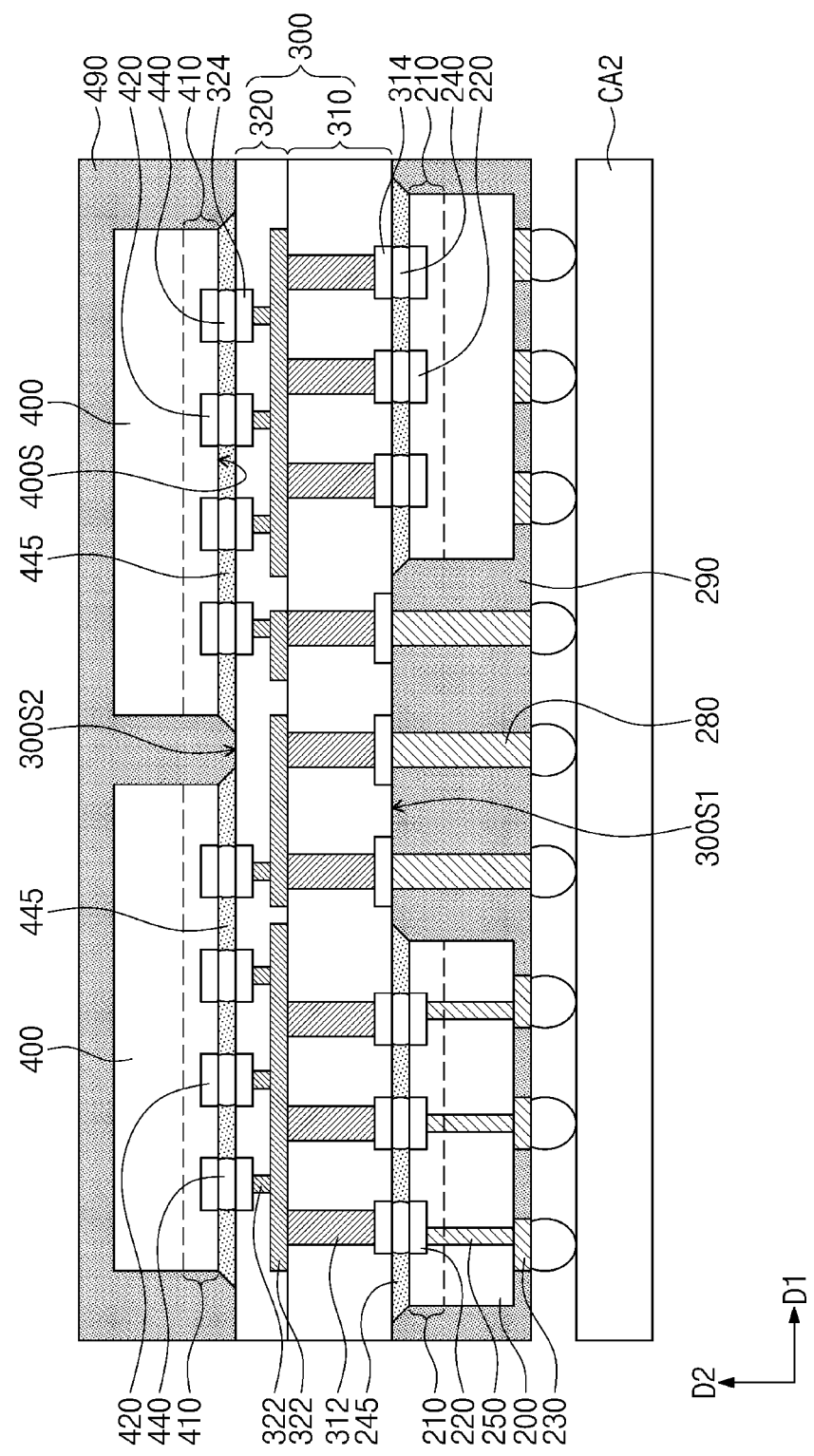
FIG. 15 illustrates a cross-sectional view taken along line I-I' of FIG. 1 descriptive of a method of manufacturing a semiconductor package, according to embodiments of the inventive concepts.

FIG. 15 illustrates a cross-sectional view taken along line I-I' of FIG. 1 descriptive of a method of manufacturing a semiconductor package, according to embodiments of the inventive concepts. Hereinafter, differences between the present embodiment of FIGS. 14 and 15 and the above embodiments described with reference to FIGS. 8 to 11 will be mainly described for convenience and brevity.

Referring to FIGS. 1 and 15, the stack structure of FIG. 10 may be provided on a second carrier substrate CA2. The first carrier substrate CA1 may be removed after the stack structure is provided on the second carrier substrate CA2.

Thereafter, the upper bumps 440 may be formed on corresponding ones of the second upper substrate pads 324, respectively, and the upper semiconductor chip(s) 400 may be mounted on the second surface 300S2 of the upper substrate 300. The upper semiconductor chip(s) 400 may be provided on the second surface 300S2 of the upper substrate 300 in such a way that the upper chip pads 420 are in contact with the upper bumps 440, respectively. The upper underfill layer 445 may be formed between the one surface 400S of the upper semiconductor chip(s) 400 and the second surface 300S2 of the upper substrate 300 and may be formed to fill a space between the upper bumps 440. In the present embodiment, an upper mold layer 490 may be formed on the second surface 300S2 of the upper substrate 300 to cover the upper semiconductor chip(s) 400.

Referring again to FIGS. 1 and 14, a stack structure formed on the second carrier substrate CA2 may be mounted on the lower substrate 100. The second carrier substrate CA2 may first be removed. The stack structure may then be provided on the top surface 100U of the lower substrate 100 in such a way that the connection bumps 260 are in contact with corresponding ones of the first lower substrate pads 110. The underfill layer 150 may be formed between the lower substrate 100 and the lower mold layer 290 and may be formed to fill a space between the connection bumps 260.

Figure 16:
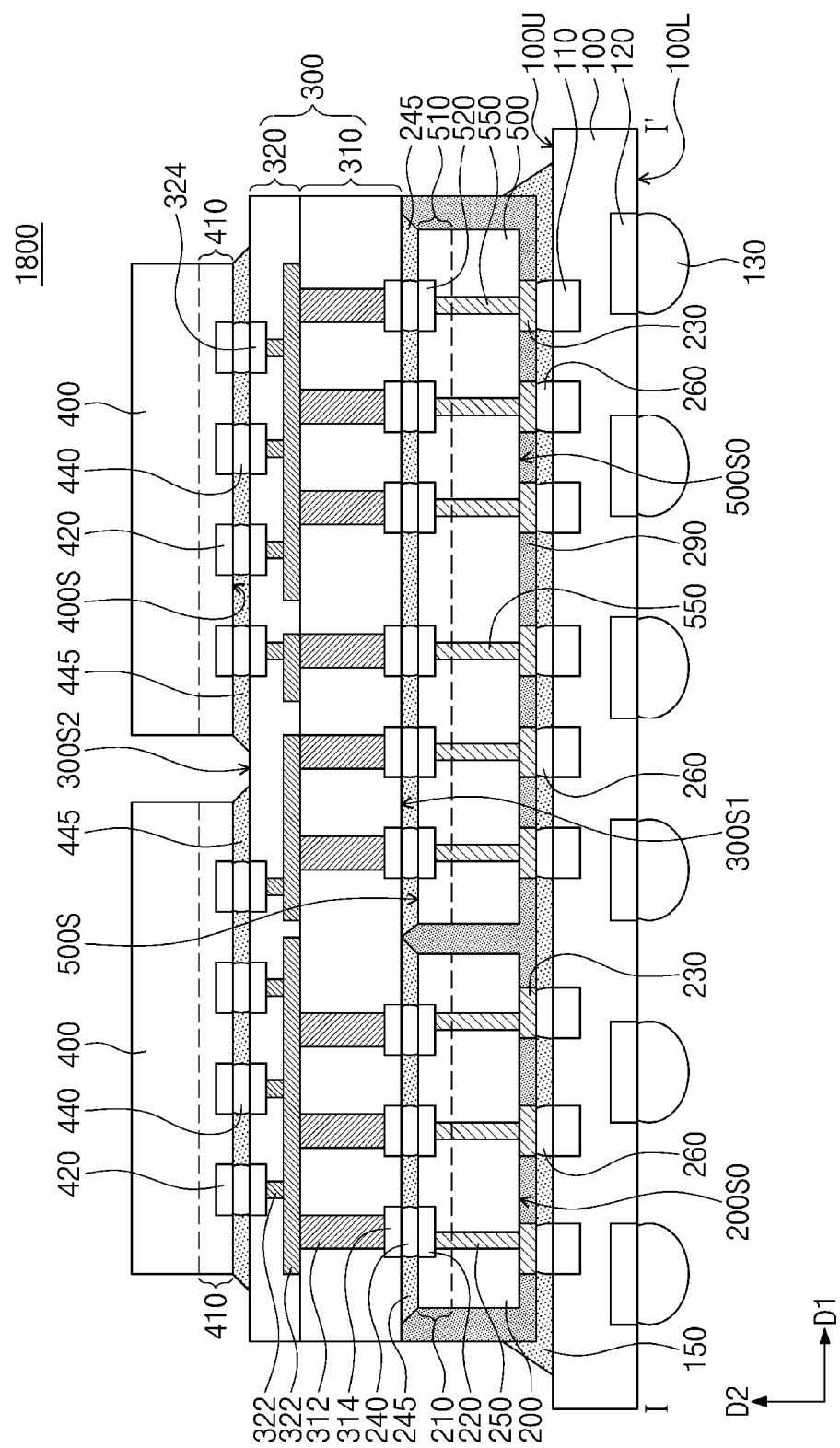
FIG. 16 illustrates a cross-sectional view of a semiconductor package 1800 taken along line I-I' of FIG. 1 according to embodiments of the inventive concepts.

FIG. 16 illustrates a cross-sectional view of a semiconductor package 1800 taken along line I-I' of FIG. 1 according to embodiments of the inventive concepts. Hereinafter, differences between the semiconductor package 1800 of FIG. 16 and the semiconductor package 1000 described with reference to FIGS. 1 and 2 will be mainly described for convenience of explanation and for brevity.

Referring to FIGS. 1 and 16, the semiconductor package 1800 may include the lower substrate 100, the upper substrate 300 on the lower substrate 100, the lower semiconductor chip 200 disposed between the lower substrate 100 and the upper substrate 300, an intermediate substrate 500 disposed at at least one side of the lower semiconductor chip 200 between the lower substrate 100 and the upper substrate 300, and the upper semiconductor chip(s) 400 disposed on the upper substrate 300.

The intermediate substrate 500 may be disposed on the first surface 300S1 of the upper substrate 300 and may be connected to the first surface 300S1 of the upper substrate 300. One surface 500S of the intermediate substrate 500 may face the first surface 300S1 of the upper substrate 300. The intermediate substrate 500 may include intermediate substrate pads 520 adjacent to the one surface 500S of the intermediate substrate 500. The intermediate substrate pads 520 may include a conductive material. The intermediate substrate pads 520 may be connected to corresponding ones of the first upper substrate pads 314. In some embodiments, the lower bumps 240 may be disposed between the intermediate substrate pads 520 and the corresponding first upper substrate pads 314. Each of the intermediate substrate pads 520 may be connected to corresponding ones of the first upper substrate pads 314 through corresponding ones of the lower bumps 240. The lower underfill layer 245 may be disposed between the one surface 500S of the intermediate substrate 500 and the first surface 300S1 of the upper substrate 300 and may cover the lower bumps 240. The lower underfill layer 245 may be locally disposed on the one surface 500S of the intermediate substrate 500 and may fill a space between the lower bumps 240.

Another surface 500SO of the intermediate substrate 500 may face the top surface 100U of the lower substrate 100. The conductive pads 230 may also be disposed on the other surface 500SO of the intermediate substrate 500.

In some embodiments, the intermediate substrate 500 may be a semiconductor chip. In this case, the intermediate substrate 500 may include an intermediate circuit layer 510 adjacent to the one surface 500S of the intermediate substrate 500. The intermediate circuit layer 510 may include integrated circuits. Alternatively, in contrast to FIG. 16, the intermediate circuit layer 510 may be disposed adjacent to the other surface 500SO of the intermediate substrate 500. The intermediate substrate 500 may include intermediate through-electrodes 550 penetrating the intermediate substrate 500, and the intermediate through-electrodes 550 may include a conductive material. Each of the intermediate through-electrodes 550 may be connected to a corresponding one of the intermediate substrate pads 520 and a corresponding one of the conductive pads 230. The conductive pads 230 may be connected to corresponding first lower substrate pads 110 of the lower substrate 100. In some embodiments, each of the conductive pads 230 may be connected to a corresponding one of the first lower substrate pads 110 through a corresponding one of the connection bumps 260.

The intermediate substrate 500 may be electrically connected to the upper substrate 300 through the intermediate substrate pads 520, the corresponding lower bumps 240, and the corresponding first upper substrate pads 314. The intermediate substrate 500 may be electrically connected to the lower substrate 100 through the intermediate through-electrodes 550, the corresponding conductive pads 230, the corresponding connection bumps 260, and the corresponding first lower substrate pads 110.

The lower mold layer 290 may be disposed between the lower substrate 100 and the upper substrate 300 and may fill a space between the lower semiconductor chip 200 and the intermediate substrate 500. The lower mold layer 290 may extend onto the other surface 200SO of the lower semiconductor chip 200 and the other surface 500SO of the intermediate substrate 500 to cover sidewalls of the conductive pads 230.

According to the present embodiment, the upper semiconductor chip 400 may be electrically connected to the lower semiconductor chip 200 and/or the intermediate substrate 500 through the upper substrate 300 and may be electrically connected to the lower substrate 100 through the lower semiconductor chip 200 and/or the intermediate substrate 500.

Figure 17:
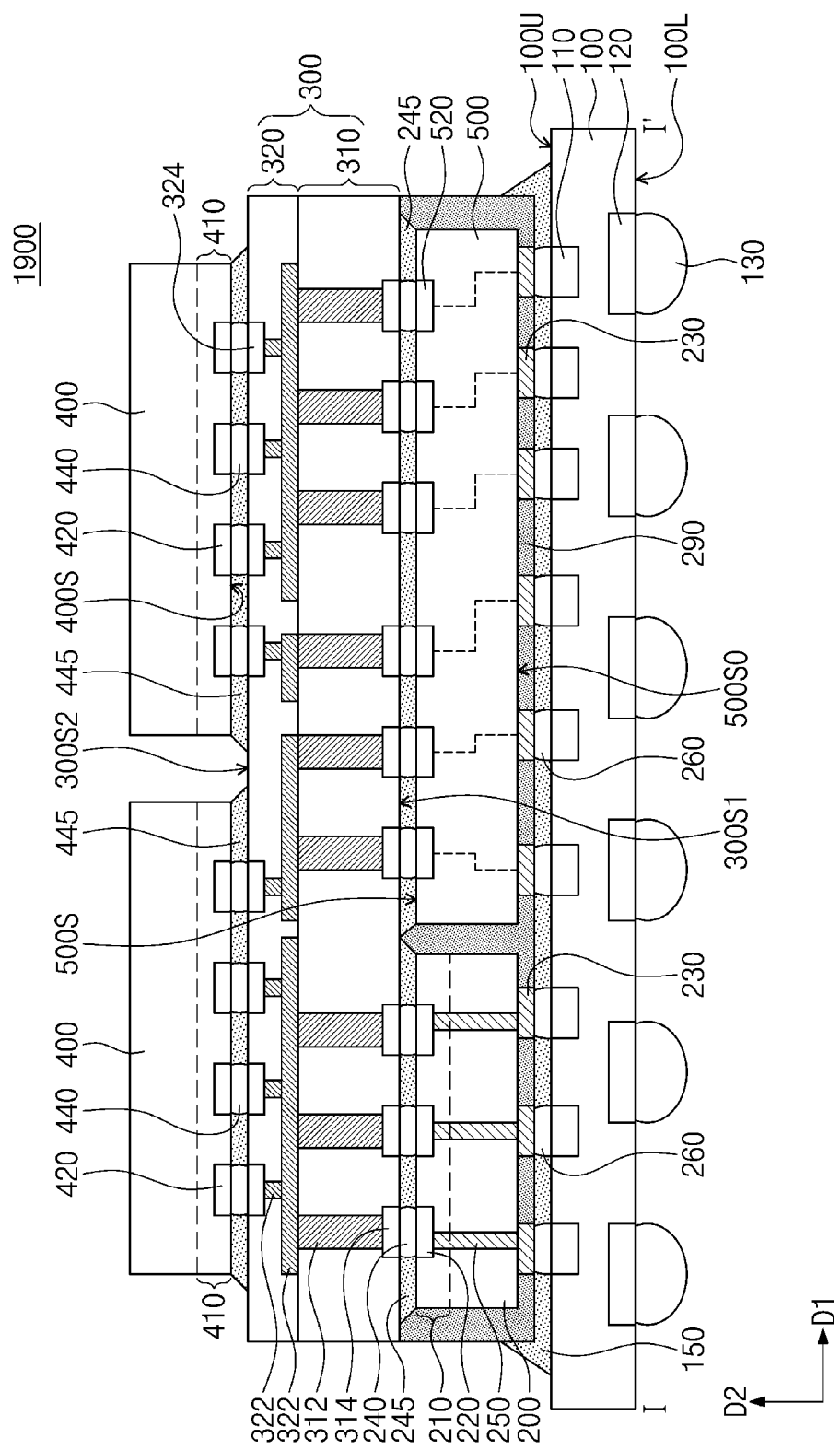
FIG. 17 illustrates a cross-sectional view of a semiconductor package 1900 taken along line I-I' of FIG. 1 according to embodiments of the inventive concepts.

FIG. 17 illustrates a cross-sectional view of a semiconductor package 1900 taken along line I-I' of FIG. 1 according to embodiments of the inventive concepts. Hereinafter, differences between the semiconductor package 1900 of FIG. 17 and the semiconductor package 1000 described with reference to FIGS. 1 and 2 will be mainly described for convenience of explanation and for brevity.

Referring to FIGS. 1 and 17, the semiconductor package 1900 may include the lower substrate 100, the upper substrate 300 on the lower substrate 100, the lower semiconductor chip 200 disposed between the lower substrate 100 and the upper substrate 300, an intermediate substrate 500 disposed at at least one side of the lower semiconductor chip 200 between the lower substrate 100 and the upper substrate 300, and the upper semiconductor chip(s) 400 disposed on the upper substrate 300.

The intermediate substrate 500 may be disposed on the first surface 300S1 of the upper substrate 300 and may be connected to the first surface 300S1 of the upper substrate 300. One surface 500S of the intermediate substrate 500 may face the first surface 300S1 of the upper substrate 300. The intermediate substrate 500 may include intermediate substrate pads 520 adjacent to the one surface 500S of the intermediate substrate 500. Another surface 500SO of the intermediate substrate 500 may face the top surface 100U of the lower substrate 100. The conductive pads 230 may also be disposed on the other surface 500SO of the intermediate substrate 500.

In some embodiments, the intermediate substrate 500 may be an interposer substrate, a printed circuit board, or a redistribution substrate. In this case, the intermediate substrate pads 520 may be electrically connected to corresponding ones of the conductive pads 230 through internal interconnection lines (illustrated by dotted lines) in the intermediate substrate 500. Except for the differences described above, other components and features of the semiconductor package 1900 according to the present embodiment may be substantially the same as corresponding components and features of the semiconductor package 1800 described with reference to FIGS. 1 and 16.

Figure 18:
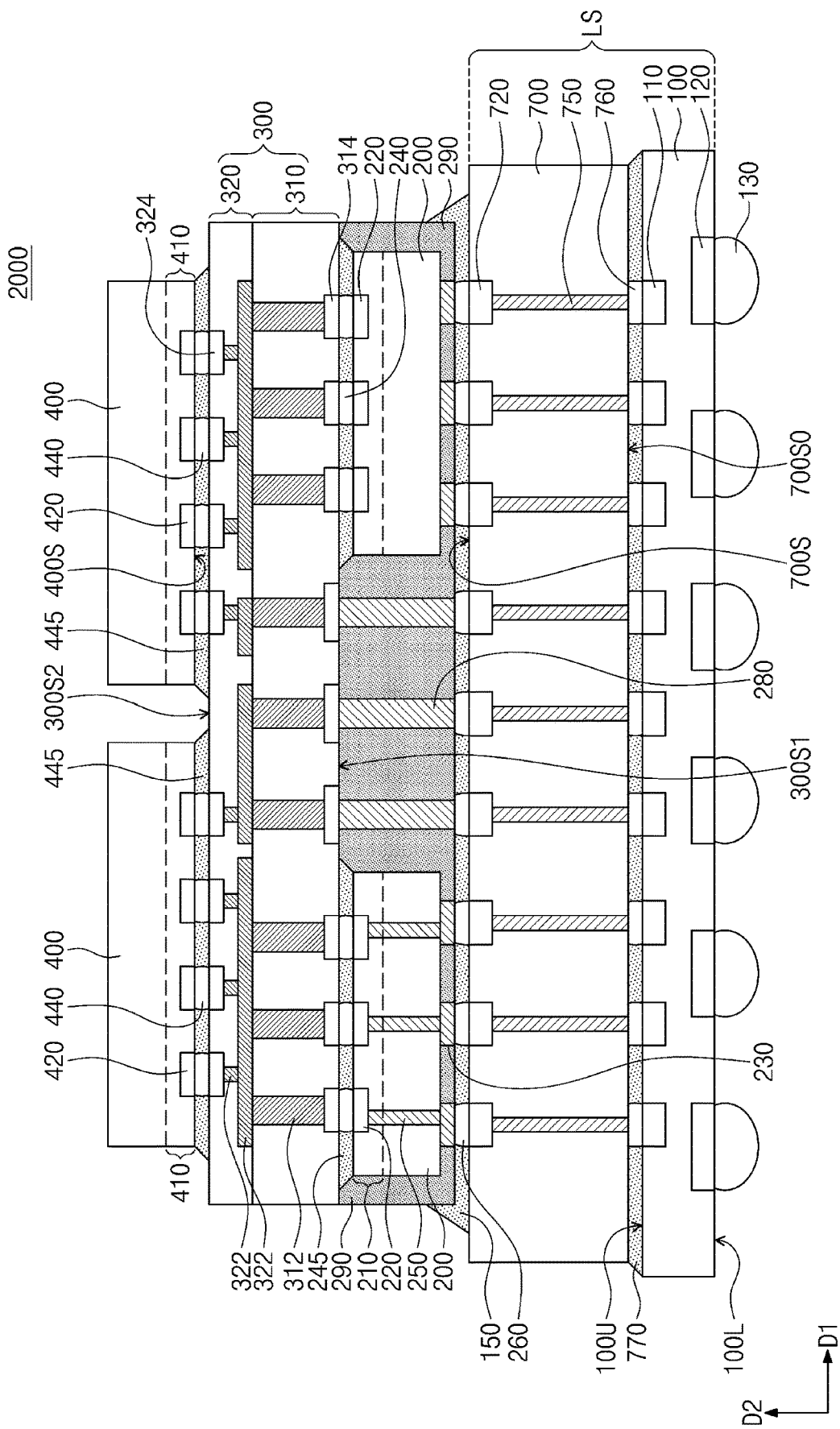
FIG. 18 illustrates a cross-sectional view of a semiconductor package 2000 taken along line I-I' of FIG. 1 according to embodiments of the inventive concepts.

FIG. 18 illustrates a cross-sectional view of a semiconductor package 2000 taken along line I-I' of FIG. 1 according to embodiments of the inventive concepts. Hereinafter, differences between the semiconductor package 2000 of FIG. 18 and the semiconductor package 1000 described with reference to FIGS. 1 and 2 will be mainly described for convenience of explanation and for brevity.

Referring to FIGS. 1 and 18, the semiconductor package 2000 may include a lower structure LS, the upper substrate 300 on the lower structure LS, the lower semiconductor chip(s) 200 disposed between the lower structure LS and the upper substrate 300, the plurality of conductive pillars 280 disposed at at least one side of the lower semiconductor chip 200 between the lower structure LS and the upper substrate 300, and the upper semiconductor chip(s) 400 disposed on the upper substrate 300.

The lower structure LS may include the lower substrate 100, and a semiconductor chip 700 on the lower substrate 100. The semiconductor chip 700 may be disposed between the lower substrate 100 and the upper substrate 300. The lower semiconductor chip(s) 200 and the plurality of conductive pillars 280 may be disposed between the semiconductor chip 700 and the upper substrate 300.

One surface 700S of the semiconductor chip 700 may face the first surface 300S1 of the upper substrate 300, and another surface 700SO of the semiconductor chip 700 may face the top surface 100U of the lower substrate 100. The semiconductor chip 700 may include chip pads 720 adjacent to the one surface 700S of the semiconductor chip 700, and the chip pads 720 may include a conductive material. The semiconductor chip 700 may include through-electrodes 750 penetrating the semiconductor chip 700, and the through-electrodes 750 may include a conductive material. The through-electrodes 750 may be connected to the chip pads 720.

The connection bumps 260 may be disposed between the conductive pads 230 and corresponding chip pads 720 and between the conductive pillars 280 and corresponding chip pads 720. Each of the conductive pads 230 and the conductive pillars 280 may be connected to a corresponding chip pad 720 through a corresponding connection bump 260. The lower semiconductor chip(s) 200 may be electrically connected to the semiconductor chip 700 through the corresponding conductive pads 230, the corresponding connection bumps 260, and the corresponding chip pads 720. The conductive pillars 280 may be electrically connected to the semiconductor chip 700 through the corresponding connection bumps 260 and the corresponding chip pads 720.

The lower mold layer 290 may be disposed between the semiconductor chip 700 and the upper substrate 300 and may fill a space between the lower semiconductor chip(s) 200 and the conductive pillars 280. The underfill layer 150 may be disposed between the semiconductor chip 700 and the lower mold layer 290 and may fill a space between the connection bumps 260.

Additional connection bumps 760 may be disposed between the semiconductor chip 700 and the lower substrate 100. The additional connection bumps 760 may be disposed between the through-electrodes 750 of the semiconductor chip 700 and the first lower substrate pads 110 of the lower substrate 100. Each of the through-electrodes 750 of the semiconductor chip 700 may be connected to a corresponding one of the first lower substrate pads 110 through a corresponding one of the additional connection bumps 760. The semiconductor chip 700 may be electrically connected to the lower substrate 100 through the through-electrodes 750, the additional connection bumps 760, and the first lower substrate pads 110. Each of the additional connection bumps 760 may include a conductive material and may have at least one of a solder ball shape, a bump shape, or a pillar shape.

An additional underfill layer 770 may be disposed between the semiconductor chip 700 and the lower substrate 100 and may fill a space between the additional connection bumps 760. The additional underfill layer 770 may include an insulating polymer material such as an epoxy resin.

Figure 19:
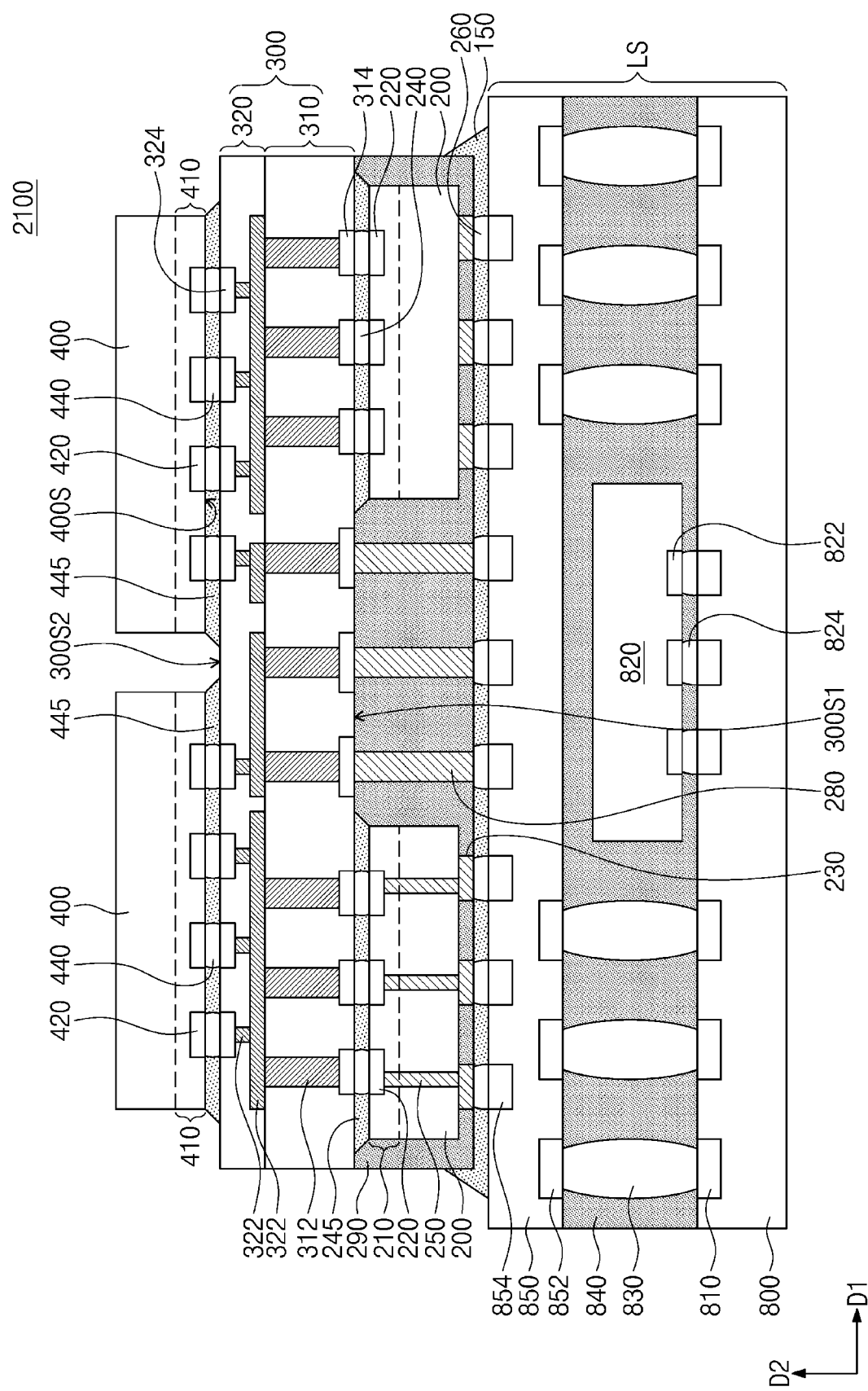
FIG. 19 illustrates a cross-sectional view of a semiconductor package 2100 taken along line I-I' of FIG. 1 according to embodiments of the inventive concepts.

FIG. 19 illustrates a cross-sectional view of a semiconductor package 2100 taken along line I-I' of FIG. 1 according to embodiments of the inventive concepts. Hereinafter, differences between the semiconductor package 2100 of FIG. 19 and the semiconductor package 1000 described with reference to FIGS. 1 and 2 will be mainly described for convenience of explanation and for brevity.

Referring to FIGS. 1 and 19, the semiconductor package 2100 may include a lower structure LS, the upper substrate 300 on the lower structure LS, the lower semiconductor chip(s) 200 disposed between the lower structure LS and the upper substrate 300, the plurality of conductive pillars 280 disposed at at least one side of the lower semiconductor chip 200 between the lower structure LS and the upper substrate 300, and the upper semiconductor chip(s) 400 disposed on the upper substrate 300.

The lower structure LS may include a lower semiconductor package. The lower structure LS may include a first substrate 800, and a semiconductor chip 820 on the first substrate 800. The first substrate 800 may be a printed circuit board or a redistribution layer. The first substrate 800 may include first substrate pads 810. The first substrate pads 810 may include a conductive material. The semiconductor chip 820 may include chip pads 822 disposed at its bottom surface. Connection portions 824 may be disposed between the first substrate 800 and the semiconductor chip 820 and may be connected to the chip pads 822, respectively. The connection portions 824 may be connected to corresponding ones of the first substrate pads 810. The chip pads 822 and the connection portions 824 may include a conductive material. Each of the connection portions 824 may have at least one of a solder ball shape, a bump shape, or a pillar shape. The semiconductor chip 820 may include integrated circuits (not shown), and the integrated circuits may be adjacent to the bottom surface of the semiconductor chip 820. The semiconductor chip 820 may be a logic chip or a memory chip.

The lower structure LS may include solder structures 830 on the first substrate 800. The solder structures 830 may be laterally spaced apart from the semiconductor chip 820. The solder structures 830 may be connected to corresponding ones of the first substrate pads 810. The solder structures 830 may include a conductive material such as for example tin, lead, silver, or an alloy thereof. Each of the solder structures 830 may be electrically connected to an external terminal or the semiconductor chip 820 through an internal interconnection line (not shown) in the first substrate 800.

The lower structure LS may include a second substrate 850 disposed on the semiconductor chip 820. The second substrate 850 may be, for example, an interposer substrate. The second substrate 850 may include first pads 852 disposed at a bottom surface of the second substrate 850, and second pads 854 disposed at a top surface of the second substrate 850. Interconnection lines (not shown) may be provided in the second substrate 850 to electrically connect the first pads 852 to the second pads 854. The first pads 852 and the second pads 854 may include a conductive material (e.g., a metal such as copper or aluminum). The solder structures 830 may be connected to the first pads 852. The second substrate 850 may be electrically connected to the first substrate 800 and the semiconductor chip 820 through the solder structures 830.

The lower structure LS may include a mold layer 840 between the first substrate 800 and the second substrate 850. The mold layer 840 may cover the semiconductor chip 820 and the solder structures 830. In some embodiments, the mold layer 840 may extend between the first substrate 800 and the semiconductor chip 820 to seal the connection portions 824. The mold layer 840 may include an insulating material (e.g., an epoxy molding compound).

The connection bumps 260 may be disposed between the conductive pads 230 and the second substrate 850 and between the conductive pillars 280 and the second substrate 850. Each of the conductive pads 230 and the conductive pillars 280 may be connected to a corresponding second pad 854 of the second substrate 850 through a corresponding connection bump 260. The lower semiconductor chip(s) 200 may be electrically connected to the lower structure LS (e.g., the lower semiconductor package) through corresponding conductive pads 230, corresponding connection bumps 260, and corresponding second pads 854. The conductive pillars 280 may be electrically connected to the lower structure LS (e.g., the lower semiconductor package) through corresponding connection bumps 260 and corresponding second pads 854.

The lower mold layer 290 may be disposed between the lower structure LS and the upper substrate 300 and may fill a space between the lower semiconductor chip(s) 200 and the conductive pillars 280. The underfill layer 150 may be disposed between the lower structure LS and the lower mold layer 290 and may fill a space between the connection bumps 260.

Figure 20:
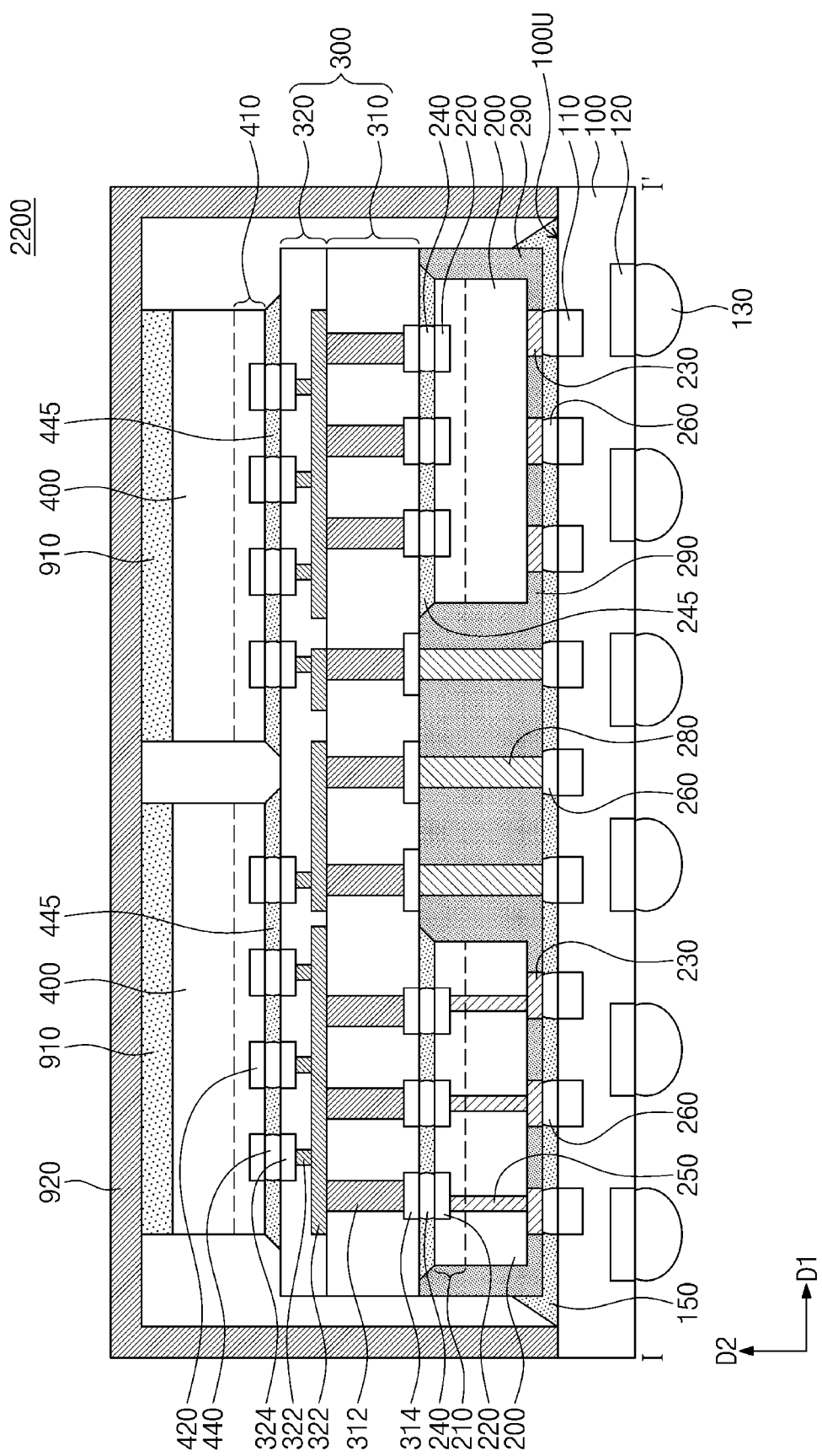
FIG. 20 illustrates a cross-sectional view of a semiconductor package 2200 taken along line I-I' of FIG. 1 according to embodiments of the inventive concepts.

FIG. 20 illustrates a cross-sectional view of a semiconductor package 2200 taken along line I-I' of FIG. 1 according to embodiments of the inventive concepts. Hereinafter, differences between the semiconductor package 2200 of FIG. 20 and the semiconductor package 1000 described with reference to FIGS. 1 and 2 will be mainly described for convenience of explanation and for brevity.

Referring to FIGS. 1 and 20, the semiconductor package 2200 may further include a heat dissipation structure 920 disposed on the lower substrate 100. The heat dissipation structure 920 may be disposed on the top surface 100U of the lower substrate 100 and may cover the upper substrate 300, the lower semiconductor chip(s) 200, the plurality of conductive pillars 280, and the upper semiconductor chip(s) 400. The heat dissipation structure 920 may include a heat-conductive material. The heat-conductive material may include a metal (e.g., copper and/or aluminum) or a carbon-containing material (e.g., graphene, graphite, and/or carbon nanotube). For example, the heat dissipation structure 920 may include a single metal layer or a plurality of stacked metal layers. As other examples, the heat dissipation structure 920 may include a heat sink or a heat pipe. As still other examples, the heat dissipation structure 920 may include a water cooling configuration.

The semiconductor package 2200 may further include a heat-conductive layer 910 disposed on the upper semiconductor chip(s) 400. The heat-conductive layer 910 may be disposed between the upper semiconductor chip(s) 400 and the heat dissipation structure 920. The heat-conductive layer 910 may include a thermal interface material (TIM). The thermal interface material (TIM) may include, for example, a polymer and heat-conductive particles. The heat-conductive particles may be dispersed in the polymer. Heat generated from the upper semiconductor chip(s) 400 may be transferred to the heat dissipation structure 920 through the heat-conductive layer 910.

According to the embodiments of the inventive concepts, a plurality of the semiconductor chips 200 and 400 vertically and horizontally stacked may be easily connected to each other through the upper substrate 300 and may be easily connected to the lower substrate 100 or the lower structure LS through the plurality of conductive pillars 280 or the intermediate substrate 500. As a result, the plurality of semiconductor chips 200 and 400 may be easily mounted on the lower substrate 100 or the lower structure LS, and thus the integration density of the semiconductor package may be easily improved or increased.

While the inventive concepts have been described with reference to example embodiments, it should be apparent to those skilled in the art that various changes and modifications may be made without departing from the spirit and scope of the inventive concepts. Therefore, it should be understood that the above embodiments are not limiting, but illustrative. Thus, the scope of the inventive concepts are to be determined by the broadest permissible interpretation of the following claims and their equivalents, and shall not be restricted or limited by the foregoing description.

What is claimed is:

1. A semiconductor package comprising:
an upper substrate having a first surface and a second surface opposite to each other, wherein the upper substrate is a silicon interposer substrate, and the first and second surfaces extend along a first direction;
a lower semiconductor chip disposed on the first surface of the upper substrate;
a plurality of conductive pillars disposed on the first surface of the upper substrate at at least one side of the lower semiconductor chip;
an upper semiconductor chip disposed on the second surface of the upper substrate,
wherein the lower semiconductor chip and the plurality of conductive pillars are connected to the first surface of the upper substrate, and
wherein the upper semiconductor chip is connected to the second surface of the upper substrate;
a lower substrate spaced apart from the first surface of the upper substrate, wherein the lower semiconductor chip and the plurality of conductive pillars are interposed between the lower substrate and the upper substrate; and
a lower redistribution layer between the lower substrate and the lower semiconductor chip along a second direction, and between the lower substrate and the plurality of conductive pillars along the second direction, the second direction perpendicular to the first direction, wherein the lower semiconductor chip and the plurality of conductive pillars are connected to the lower redistribution layer.

2. The semiconductor package of claim 1, wherein the upper semiconductor chip is one of a plurality of upper semiconductor chips laterally spaced apart from each other along the first direction on the second surface of the upper substrate, and wherein each of the plurality of upper semiconductor chips is connected to the second surface of the upper substrate.

3. The semiconductor package of claim 1, wherein the lower semiconductor chip is one of a plurality of lower semiconductor chips laterally spaced apart from each other along the first direction on the first surface of the upper substrate, and wherein each of the plurality of lower semiconductor chips is connected to the first surface of the upper substrate.

4. The semiconductor package of claim 3, wherein at least one of the plurality of lower semiconductor chips comprises at least one lower through-electrode penetrating therethrough.

5. The semiconductor package of claim 1, wherein the silicon interposer substrate comprises metal interconnection lines, wherein the metal interconnection lines are adjacent to the second surface of the upper substrate, and wherein the upper semiconductor chip is connected to the metal interconnection lines.

6. The semiconductor package of claim 5, wherein the silicon interposer substrate further comprises through-vias connected to the metal interconnection lines, and wherein the through-vias vertically extend from the metal interconnection lines along the second direction toward the first surface of the upper substrate.

7. The semiconductor package of claim 1, further comprising a lower mold layer on the lower redistribution layer, the lower mold layer covering the lower semiconductor chip and the plurality of conductive pillars.

8. The semiconductor package of claim 7, further comprising an upper mold layer on the second surface of the upper substrate, the upper mold layer covering the upper semiconductor chip.

9. The semiconductor package of claim 1, wherein the upper substrate comprises an upper redistribution layer disposed adjacent to the first surface, and wherein the lower semiconductor chip and the plurality of conductive pillars are connected to the upper redistribution layer.

10. A semiconductor package comprising:

an upper substrate having a first surface and a second surface opposite to each other, wherein the upper substrate is a silicon interposer substrate, and the first and second surfaces extend along a first direction;

a lower semiconductor chip disposed on the first surface of the upper substrate;

a plurality of conductive pillars disposed on the first surface of the upper substrate at at least one side of the lower semiconductor chip;

an upper semiconductor chip disposed on the second surface of the upper substrate, wherein the lower semiconductor chip and the plurality of conductive pillars are connected to the first surface of the upper substrate, and wherein the upper semiconductor chip is connected to the second surface of the upper substrate;

a lower structure spaced apart from the first surface of the upper substrate, wherein the lower semiconductor chip and the plurality of conductive pillars are interposed between the lower structure and the upper substrate, wherein the plurality of conductive pillars is connected to the lower structure, and wherein the lower structure comprises a printed circuit board, a semiconductor chip, or a lower semiconductor package; and a heat dissipation structure disposed on the lower structure and on the upper semiconductor chip, the heat dissipation structure covering the upper semiconductor chip, the upper substrate, the lower semiconductor chip, and the plurality of conductive pillars.

11. A semiconductor package comprising:

an upper substrate having a first surface and a second surface opposite to each other, wherein the upper substrate is a silicon interposer substrate comprising a through-via layer, and a metal interconnection layer on the through-via layer, the metal interconnection layer adjacent to the second surface;

a plurality of lower semiconductor chips on the first surface of the upper substrate and laterally spaced apart from each other in a first direction parallel to the first surface of the upper substrate;

a plurality of conductive pillars on the first surface of the upper substrate and laterally spaced apart from the plurality of lower semiconductor chips in the first direction;

a plurality of upper semiconductor chips on the second surface of the upper substrate and laterally spaced apart from each other in the first direction;

a lower structure spaced apart from the first surface of the upper substrate in a second direction perpendicular to the first surface of the upper substrate, wherein the plurality of lower semiconductor chips and the plurality of conductive pillars are interposed between the lower structure and the upper substrate; and a lower redistribution layer between the lower structure and the plurality of lower semiconductor chips along the second direction, and between the lower structure and the plurality of conductive pillars along the second direction, wherein the upper substrate comprises first upper substrate pads adjacent to the first surface, and second upper substrate pads adjacent to the second surface, wherein each of the plurality of lower semiconductor chips include lower chip pads connected to corresponding ones of the first upper substrate pads, and the plurality of conductive pillars are connected to other corresponding ones of the first upper substrate pads, wherein the plurality of lower semiconductor chips and the plurality of conductive pillars are connected to through-vias in the through-via layer through the first upper substrate pads, wherein each of the plurality of upper semiconductor chips include upper chip pads connected to corresponding ones of the second upper substrate pads, wherein the plurality of upper semiconductor chips are connected to metal interconnection lines in the metal interconnection layer through the second upper substrate pads, and wherein the plurality of lower semiconductor chips and the plurality of conductive pillars are connected to the lower redistribution layer.

12. The semiconductor package of claim 11, wherein each of the plurality of upper semiconductor chips includes a first surface that faces the second surface of the upper substrate, and the upper chip pads are adjacent to the first surface of the plurality of upper semiconductor chips, wherein each of the plurality of upper semiconductor chips comprises an upper circuit layer adjacent to the first surface of the plurality of upper semiconductor chips.

13. The semiconductor package of claim 12, wherein each of the plurality of lower semiconductor chips includes a first surface that faces the first surface of the upper substrate, and the lower chip pads are adjacent to the first surface of the plurality of lower semiconductor chips, wherein at least one of the plurality of lower semiconductor chips comprises a lower circuit layer adjacent to the first surface of the at least one of the plurality of lower semiconductor chips.

14. The semiconductor package of claim 11, the lower structure includes pads, wherein the lower redistribution layer is connected to corresponding ones of the pads of the lower structure, and wherein the lower structure comprises a printed circuit board, a semiconductor chip, or a lower semiconductor package.

15. The semiconductor package of claim 14, further comprising a heat dissipation structure on the lower structure, the heat dissipation structure covering the plurality of upper semiconductor chips, the upper substrate, the plurality of lower semiconductor chips, and the plurality of conductive pillars.

16. The semiconductor package of claim 11, wherein the through-vias are connected to the metal interconnection lines and extend from the metal interconnection lines toward the first surface of the upper substrate, and wherein the upper semiconductor chips are connected to the metal interconnection lines through the upper chip pads and the second upper substrate pads.

17. The semiconductor package of claim 1, further comprising a plurality of connection bumps disposed between and electrically connecting the lower redistribution layer and the lower substrate.

* * * * *